(12) United States Patent
Plum

(10) Patent No.: US 7,829,410 B2
(45) Date of Patent: Nov. 9, 2010

(54) METHODS OF FORMING CAPACITORS, AND METHODS OF FORMING DRAM ARRAYS

(75) Inventor: Todd Jackson Plum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 429 days.

(21) Appl. No.: 11/945,103

(22) Filed: Nov. 26, 2007

(65) Prior Publication Data
US 2009/0134491 A1 May 28, 2009

(51) Int. Cl.
*H01L 21/8242* (2006.01)
*H01L 21/20* (2006.01)

(52) U.S. Cl. .............. 438/244; 438/387; 257/E21.647; 257/E29.001

(58) Field of Classification Search ................ 438/244, 438/387; 257/E21.647, E21.09, E29.001
See application file for complete search history.

(56) References Cited

U.S. PATENT DOCUMENTS

| | | | |
|---|---|---|---|
| 5,338,700 A | 8/1994 | Dennison et al. | |
| 5,595,928 A | 1/1997 | Lu et al. | |
| 5,650,351 A | 7/1997 | Wu | |
| 5,663,093 A | 9/1997 | Tseng et al. | |
| 5,783,462 A | 7/1998 | Huang | |
| 5,962,885 A | 10/1999 | Fischer et al. | |
| 6,190,964 B1 | 2/2001 | Winters | |
| 6,204,143 B1 | 3/2001 | Roberts et al. | |
| 6,251,726 B1 | 6/2001 | Huang | |
| 6,362,043 B2 | 3/2002 | Noble | |
| 6,791,135 B2 | 9/2004 | Takenaka | |
| 7,112,487 B2 | 9/2006 | Gutsche et al. | |
| 7,112,840 B2 | 9/2006 | Kim et al. | |
| 7,271,051 B2 | 9/2007 | Manning et al. | |
| 7,315,466 B2 * | 1/2008 | Han et al. ................ 365/154 |

(Continued)

FOREIGN PATENT DOCUMENTS

GB    2321769 A    8/1998

(Continued)

OTHER PUBLICATIONS

Kim, D.H. et al. "A Mechanically Enhanced Storage node for virtually unlimited Height (MESH) Capacitor Aiming at sub 70nm DRAMs" IEEE Jan. 2004; pp. 3.4.1-3.4.4.

(Continued)

*Primary Examiner*—David S Blum
(74) *Attorney, Agent, or Firm*—Wells St. John P.S.

(57) ABSTRACT

Some embodiments include methods of forming capacitors. A first section of a capacitor may be formed to include a first storage node, a first dielectric material, and a first plate material. A second section of the capacitor may be formed to include a second storage node, a second dielectric material, and a second plate material. The first and second sections may be formed over a memory array region, and the first and second plate materials may be electrically connected to first and second interconnects, respectively, that extend to over a region peripheral to the memory array region. The first and second interconnects may be electrically connected to one another to couple the first and second plate materials to one another. Some embodiments include capacitor structures, and some embodiments include methods of forming DRAM arrays.

20 Claims, 25 Drawing Sheets

U.S. PATENT DOCUMENTS

| | | | |
|---|---|---|---|
| 7,489,564 B2 * | 2/2009 | Keeth et al. | 365/189.05 |
| 2002/0050606 A1 | 5/2002 | Buerger, Jr. | |
| 2004/0016957 A1 | 1/2004 | Wu | |
| 2006/0202250 A1 | 9/2006 | Hecht et al. | |
| 2006/0211178 A1 | 9/2006 | Kim et al. | |
| 2006/0261396 A1 | 11/2006 | Joo | |
| 2007/0001208 A1 | 1/2007 | Graham et al. | |
| 2007/0117340 A1 | 5/2007 | Steltenpohl | |
| 2007/0232013 A1 | 10/2007 | Manning et al. | |
| 2007/0235786 A1 | 10/2007 | Kapteyn et al. | |

FOREIGN PATENT DOCUMENTS

| | | |
|---|---|---|
| KR | 10200713072 A | 1/2007 |
| WO | PCT/US2008/080196 | 6/2006 |
| WO | PCT/US2008/080196 | 6/2009 |

OTHER PUBLICATIONS

Sim, S.P., et al. "A New Planar Stacked Technology (PST) for Scaled and Embedded DRAMs" IEEE © 1996 pp. 22.3.1-22.3.4.

Nemati, Farid "A Novel High Density, Low Voltage SRAM Cell with a Vertical NDR Device" 1998 Symposium on VLSI Technology Digest of Technical Papers, Jun. 1998 pp. 66-67.

Horii, Hideki, et al. "A Self-aligned Stacked Capacitor using Novel Pt Electroplating Method for 1 Gbit DRAMs and Beyond" 1999 Symposium on VLSI Technology Digest of Technical Papers; pp. 103-104.

* cited by examiner

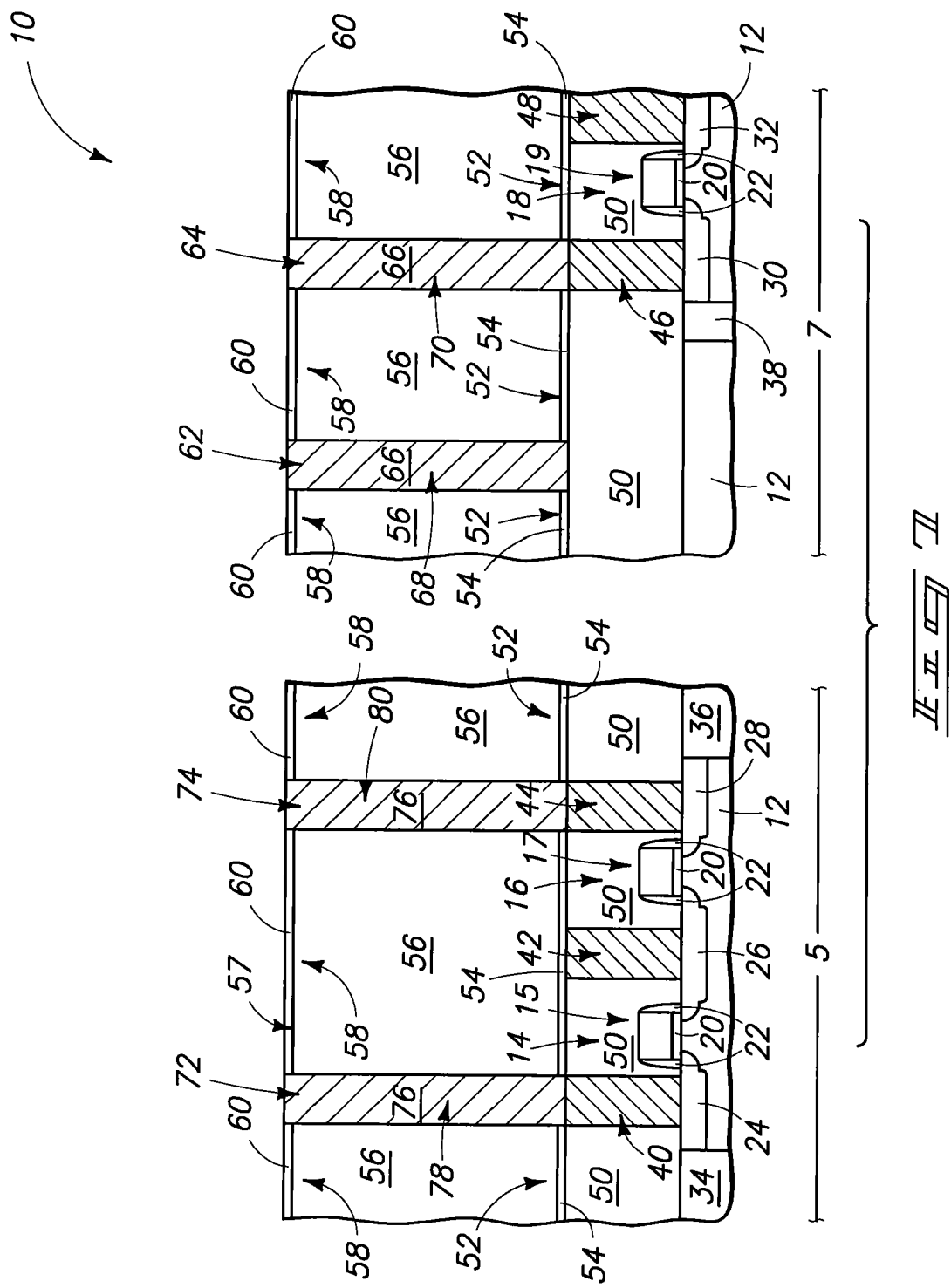
F I G 7

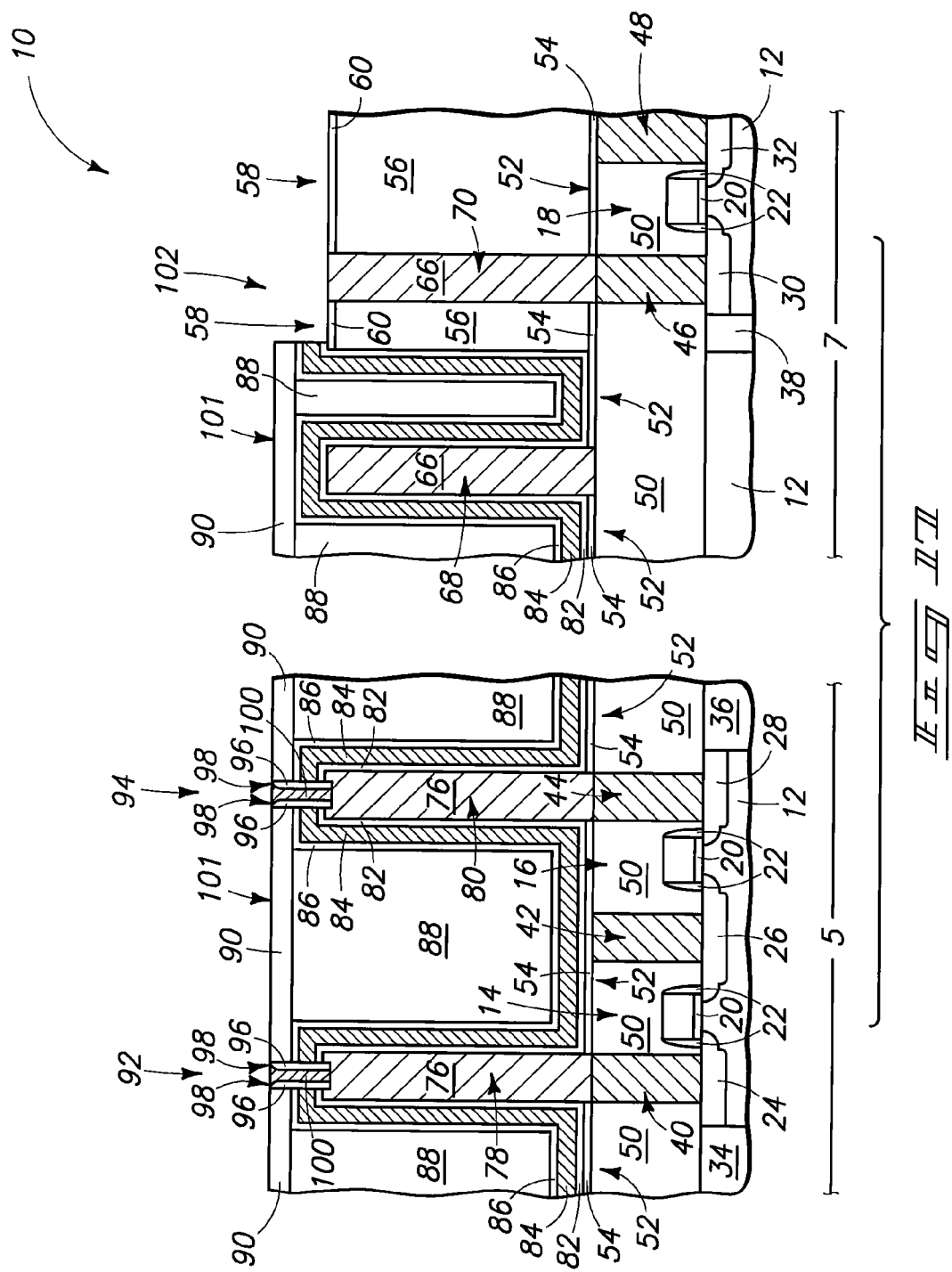

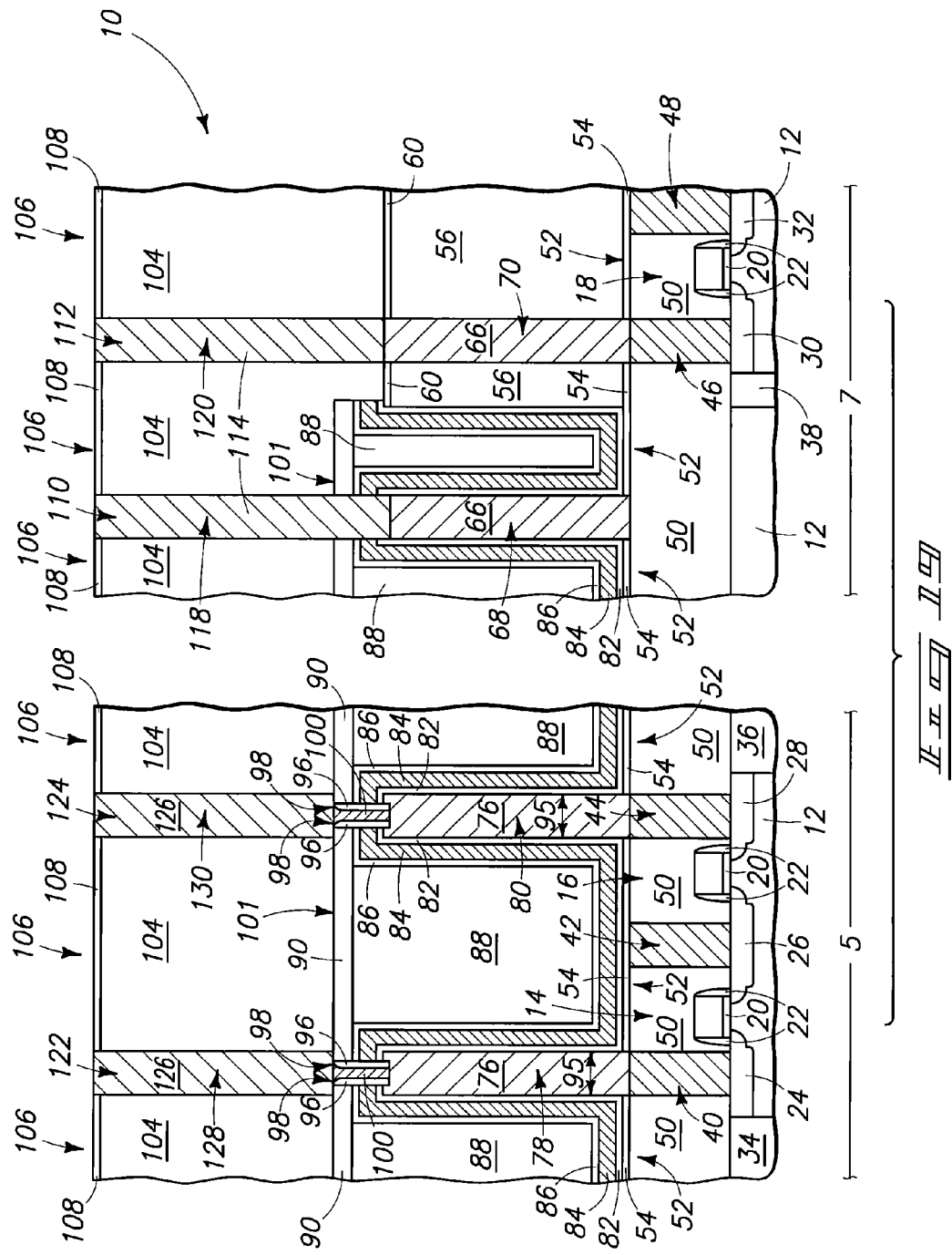

METHODS OF FORMING CAPACITORS, AND METHODS OF FORMING DRAM ARRAYS

TECHNICAL FIELD

Semiconductor constructions, methods of forming capacitors, and methods of forming DRAM arrays.

BACKGROUND

Semiconductor devices are commonly utilized for data storage and processing. The data storage may utilize an array of memory devices. Some memory devices are particularly well-suited for long-term storage of data, while others are better suited for rapid reading and writing (in other words, rapid access). Among the memory devices that are particularly well-suited for rapid access are dynamic random access memory (DRAM) devices. A DRAM unit cell may include a transistor in combination with a capacitor.

A continuing goal of semiconductor fabrication is to reduce the amount of semiconductor real estate consumed by various components to thereby increase integration. It is, however, difficult to reduce the amount of semiconductor real estate consumed by a capacitor while still maintaining desired levels of capacitance. Some methods for reducing the amount of real estate consumed by capacitors, while maintaining desired levels of capacitance, include forming the capacitors to be increasingly thinner and taller.

A capacitor may be formed by patterning an opening in a template material, filling the opening with storage node material, and then removing the template material to leave a capacitor storage node comprising the storage node material. The capacitor storage node may be shaped as a pillar projecting upwardly from a semiconductor substrate. Subsequently, capacitor dielectric material may be formed across the pillar, and capacitor plate material may be formed across the capacitor dielectric material. The capacitor plate material, capacitor dielectric material, and storage node may together form a capacitor.

Difficulties occur as capacitors become thinner and taller in that it becomes increasingly difficult to pattern openings in a template material, and increasingly difficult to fill the openings with capacitor storage node material. Additionally, there is increasing risk that the tall, thin capacitor storage nodes will tip, and possibly topple, before the capacitor dielectric material and capacitor plate material can be formed to provide support to the tall, thin capacitor storage nodes.

It is desired to develop improved methods for forming tall, thin capacitors; and to develop improved capacitor constructions.

BRIEF DESCRIPTION OF THE DRAWINGS

FIGS. 2-22 are views of the fragments of FIG. 1 shown at various processing stages of an embodiment.

DETAILED DESCRIPTION OF TUE ILLUSTRATED EMBODIMENTS

Some embodiments include methods in which pillar capacitors are formed by stacking sections (or segments) of the capacitors on top of one another to achieve very high aspect ratio capacitors. In some embodiments, the pillar capacitors may be considered to comprise modules which are designed so that each time a fabrication process of a module is repeated the capacitor gets taller without getting wider. The embodiments may be utilized to form extremely dense capacitor arrays, and such capacitor arrays may be incorporated into highly integrated DRAM arrays. Although the example embodiments shown in the accompanying figures utilize pillar-type capacitor modules, in other embodiments one or more of the modules may comprise a capacitor storage node unit configured as a container, so that at least a portion of the capacitor will comprise a container-type capacitor segment.

Example embodiments are described with reference to FIGS. 1-27.

Figure 1:
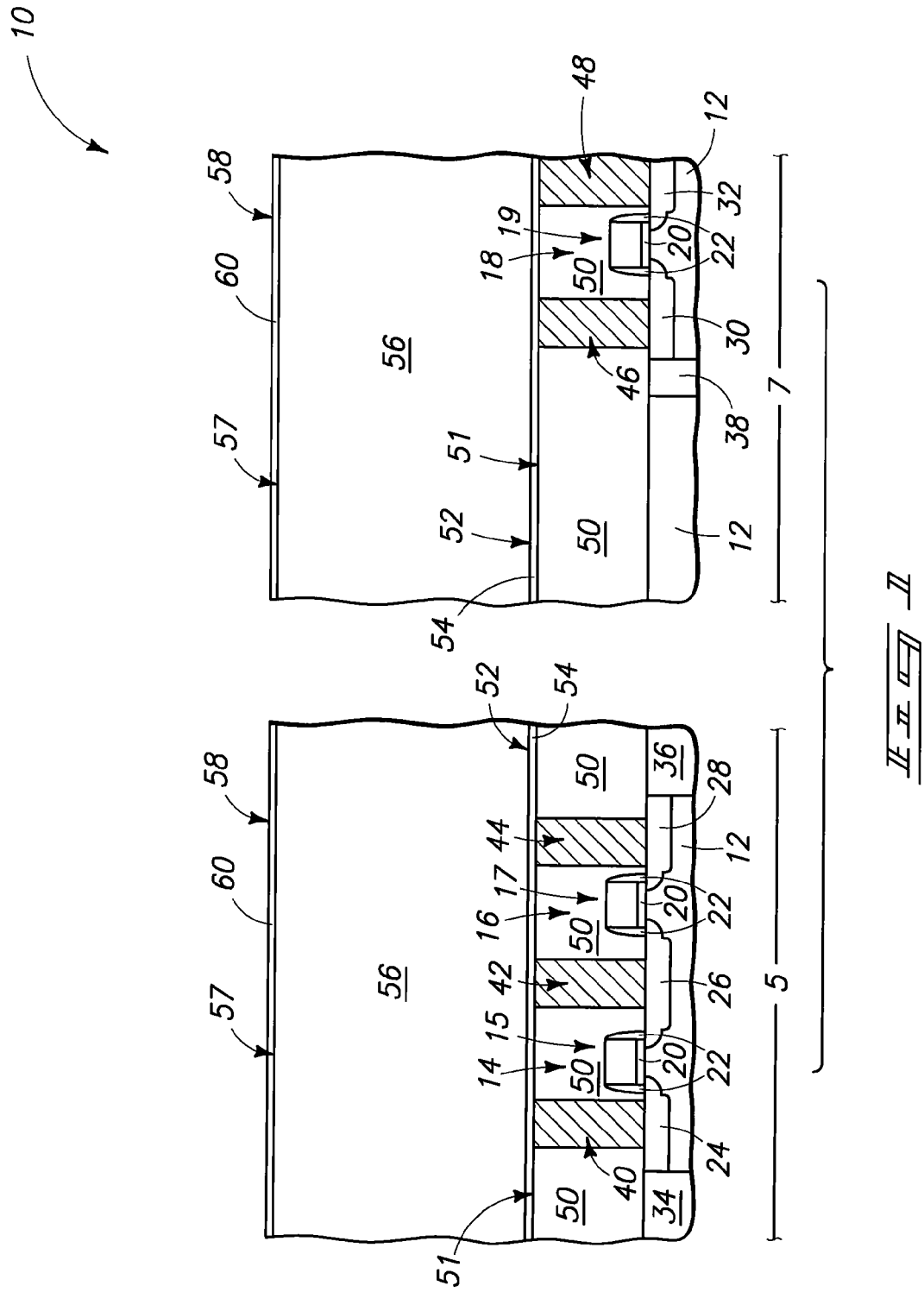
FIG. 1 is a diagrammatic, cross-sectional view of a pair of fragments of a semiconductor construction at a processing stage of an embodiment.
Figure 1B:
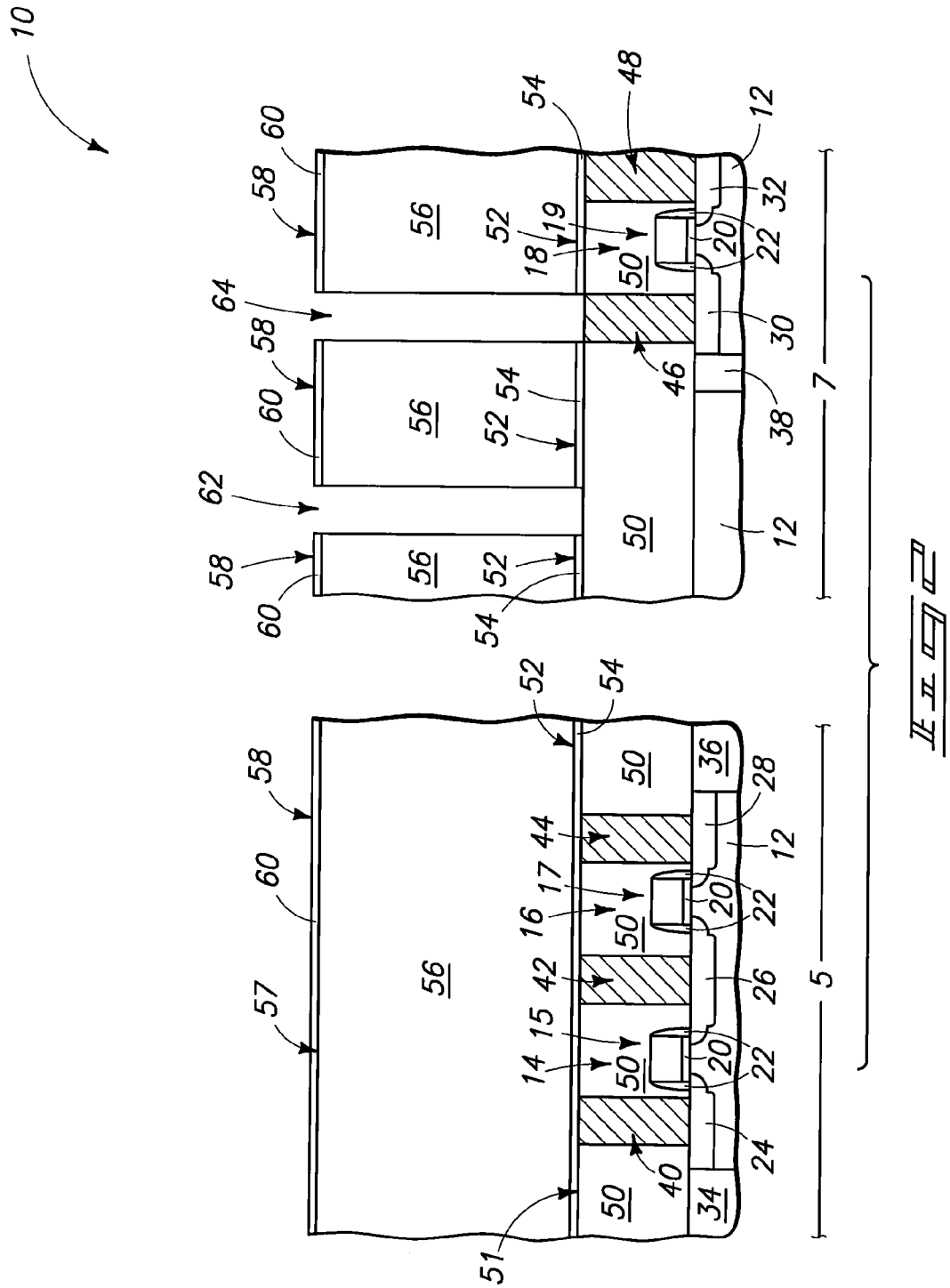

Referring to FIG. 1, a semiconductor construction 10 is shown to be divided between a first defined segment 5 corresponding to a memory array region, and a second defined segment 7 corresponding to a region peripheral to the memory array region. The region 7 may be referred to as a peripheral region.

Semiconductor construction 10 comprises a base 12 which supports a plurality of transistor constructions 14, 16 and 18.

Base 12 may comprise any suitable semiconductor material, and in some embodiments may comprise, consist essentially of, or consist of monocrystalline silicon lightly background-doped with appropriate dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

The transistor constructions 14, 16 and 18 comprise transistor gates 15, 17 and 19, respectively, spaced from substrate 12 by gate dielectric material 20. The gate dielectric material may comprise any suitable material, and may, for example, comprise, consist essentially of, or consist of silicon dioxide. The gates 15, 17 and 19 may comprise any suitable composition or combination of compositions, and may, for example, comprise electrically conductive material capped by electrically insulative material. For instance, the gates may comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon), capped by silicon nitride.

The transistor constructions also comprise electrically insulative spacers 22 along opposing sidewalls of the gates. The spacers 22 may comprise any suitable composition or combination of compositions; and may, for example, comprise silicon nitride.

The transistor constructions further comprise source/drain regions 24, 26, 28, 30 and 32. Source/drain region 24 is part of transistor 14, source/drain region 28 is part of transistor 16, and source/drain regions 30 and 32 are part of transistor 18. The source/drain region 26 is shared by transistors 14 and 16.

The transistor 18 is an example of an electrical component that may be formed over the peripheral region 7. Such electrical components may be utilized in logic or other circuitry for controlling reading and writing of data to memory circuitry ultimately formed over memory array region 5. The transistors 14 and 16 are examples of a pair of transistors configured for utilization in a high-density DRAM array, and may correspond to NMOS transistors. Ultimately, capacitors are formed in electrical connection with source/drain regions 24 and 28, a bitline (which may also be referred to as a digit line) is formed in electrical connection with source/drain region 26, and the gates 15 and 17 are part of wordlines that extend into and out of the page relative to the shown cross-sectional view of FIG. 1. The bitline may also be in electrical contact with source/drain region 32.

Isolation regions 34, 36 and 38 are shown extending into base 12 to electrically isolate transistors 14, 16 and 18 from other circuitry (not shown) that may be associated with construction 10.

Electrically conductive pillars (or pedestals) 40, 42, 44, 46 and 48 are electrically connected with source/drain regions 24, 26, 28, 30 and 32. The pillars are optional, and accordingly one or more of the pillars may be omitted from some embodiments. However, the pillars may simplify electrical connection of the source/drain regions to other circuitry formed above the source/drain regions. The pillars 40, 42, 44, 46 and 48 may comprise any suitable composition or combination of compositions; and may, for example, comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon).

The pillars 40, 42, 44, 46 and 48 are spaced from one another by electrically insulative material 50. Material 50 may comprise any suitable composition or combination of compositions; and may, for example, comprise one or both of silicon dioxide and borophosphosilicate glass (BPSG).

The upper surfaces of pillars 40 and 44 may be considered to be storage node contact locations, in that capacitor storage nodes are ultimately formed to be in electrical contact with such upper surfaces. If pillars 40 and 44 are omitted, the upper surfaces of source/drain regions 24 and 26 may be the storage node contact locations.

A planarized surface 51 extends across material 50 and pillars 40, 42, 44, 46 and 48. Such planarized surface may be formed by, for example, chemical-mechanical polishing (CMP). Planarized surface 51 may be referred to as a first planarized upper surface to distinguish it from other planarized surfaces provided thereover.

A protective layer 52 is formed over planarized surface 51. The protective layer 52 comprises a material 54. Such material may include any suitable composition or combination of compositions; and may, for example, comprise, consist essentially of, or consist of silicon nitride.

In some embodiments, the bitline referred to above may extend across and in direct contact with upper surfaces of pillars 42 and 48 so that such upper surfaces contact an electrically conductive bitline (not shown) rather than contacting layer 52. In other embodiments, the bitline (not shown) may extend under or through source/drain regions 26 and 32.

A material 56 is formed over protective layer 52. Material 56 may be referred to as a template material in that openings are ultimately formed in material 56 to create a template for fabrication of capacitor storage nodes. Alternatively, material 56 may be referred to as a first material to distinguish material 56 from other template materials that are subsequently formed over material 56. Material 56 may comprise any suitable composition or combination of compositions; and may, for example, comprise, consist essentially of, or consist of one or both of silicon dioxide, and BPSG. In some embodiments, other doped oxides may be utilized in addition to, or alternatively to BPSG, with examples of other doped oxides including phosphosilicate glass (PSG) and fluorosilicate glass (FSG).

Material 56 comprises a planarized upper surface 57. Such planarized upper surface may result from layer 56 forming conformally across an upper surface of protective layer 52, by reflowing material 56 during its deposition, and/or from CMP of an upper surface of material 56. Planarized upper surface 57 may be referred to as a second planarized upper surface to distinguish it from the planarized upper surface 51.

The thickness of material 56 determines a thickness of first modules, or segments, of capacitors formed over memory array region 5.

An etch stop layer 58 is formed over material 56. Etch stop layer 58 comprises a material 60. The material 60 may comprise any suitable composition or combination of compositions; and may, for example, comprise, consist essentially of, or consist of silicon nitride.

Figure 22:
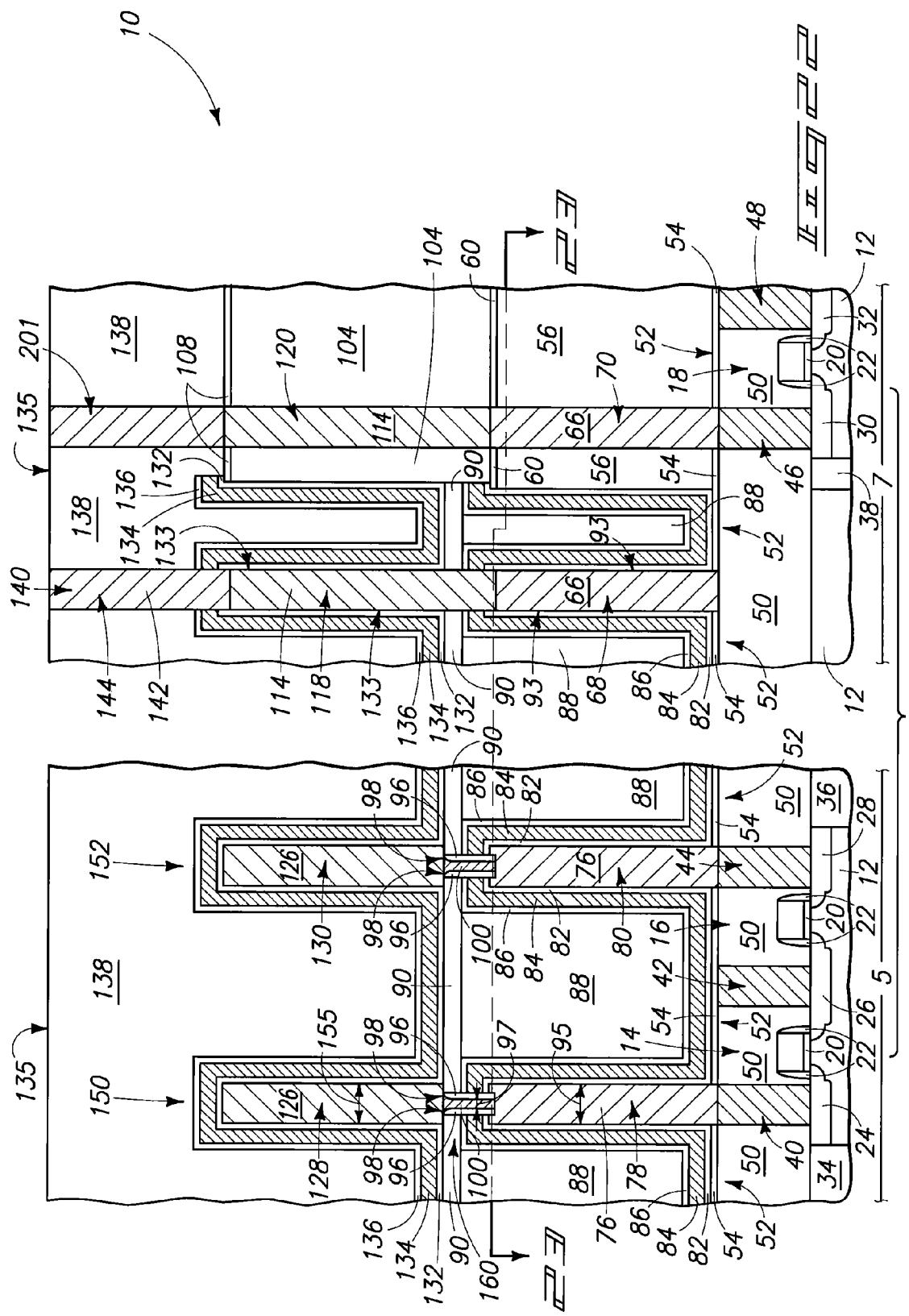

Referring to FIG. 2, openings 62 and 64 are formed over peripheral region 7. Specifically, the openings are etched through materials 54, 56 and 60. The opening 64 extends to an upper surface of pedestal 46, and is thus a contact opening to peripheral circuitry. The opening 62 is ultimately utilized for forming an interconnect which will be utilized to connect capacitor plates in forming a capacitor construction (such interconnect is shown in FIG. 22). Opening 62 is thus utilized to form circuitry that is interconnected with capacitor constructions ultimately formed across the memory array region 5, as discussed below.

Openings 62 and 64 may be formed utilizing any suitable method. For instance, photolithographically-patterned photoresist (not shown) may be provided over material 60 to define locations of openings 62 and 64; a pattern may be transferred from the photoresist to underlying materials 54, 56 and 60 with one or more suitable etches; and the photoresist may then be removed to leave the shown construction of FIG. 2. The etches may be highly anisotropic, and may be utilized to slightly over-etch conductive pedestal 46 to ensure good electrical connection to the conductive pedestal with electrically conductive material subsequently formed in opening 64.

Figure 3:
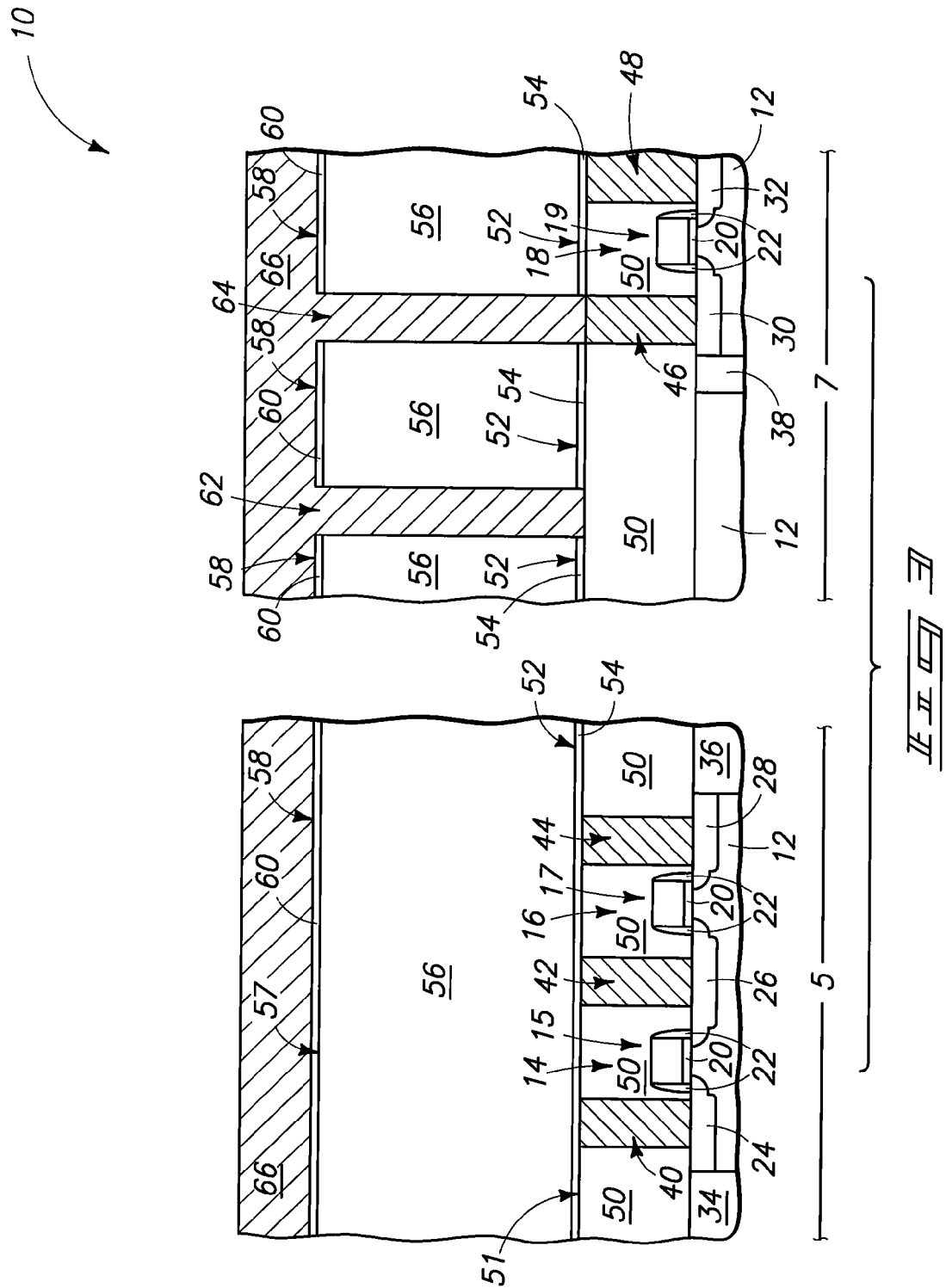

Referring to FIG. 3, electrically conductive material 66 is formed over layer 58 and within openings 62 and 64. Electrically conductive material 66 may comprise any suitable composition or combination of compositions; and may, for example, comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon). The electrically conductive material 66 within opening 62 may be referred to as interconnect material, in that such material is ultimately utilized to form an interconnect for electrically coupling two or more capacitor plates to one another.

The material 66 may be formed by any suitable method, including, for example, one or more of atomic layer deposition (ALD), chemical vapor deposition (CVD), and physical vapor deposition (PVD). The method utilized to deposit material 66 may form the material to fill openings 62 and 64 without forming voids within the openings.

Figure 4:
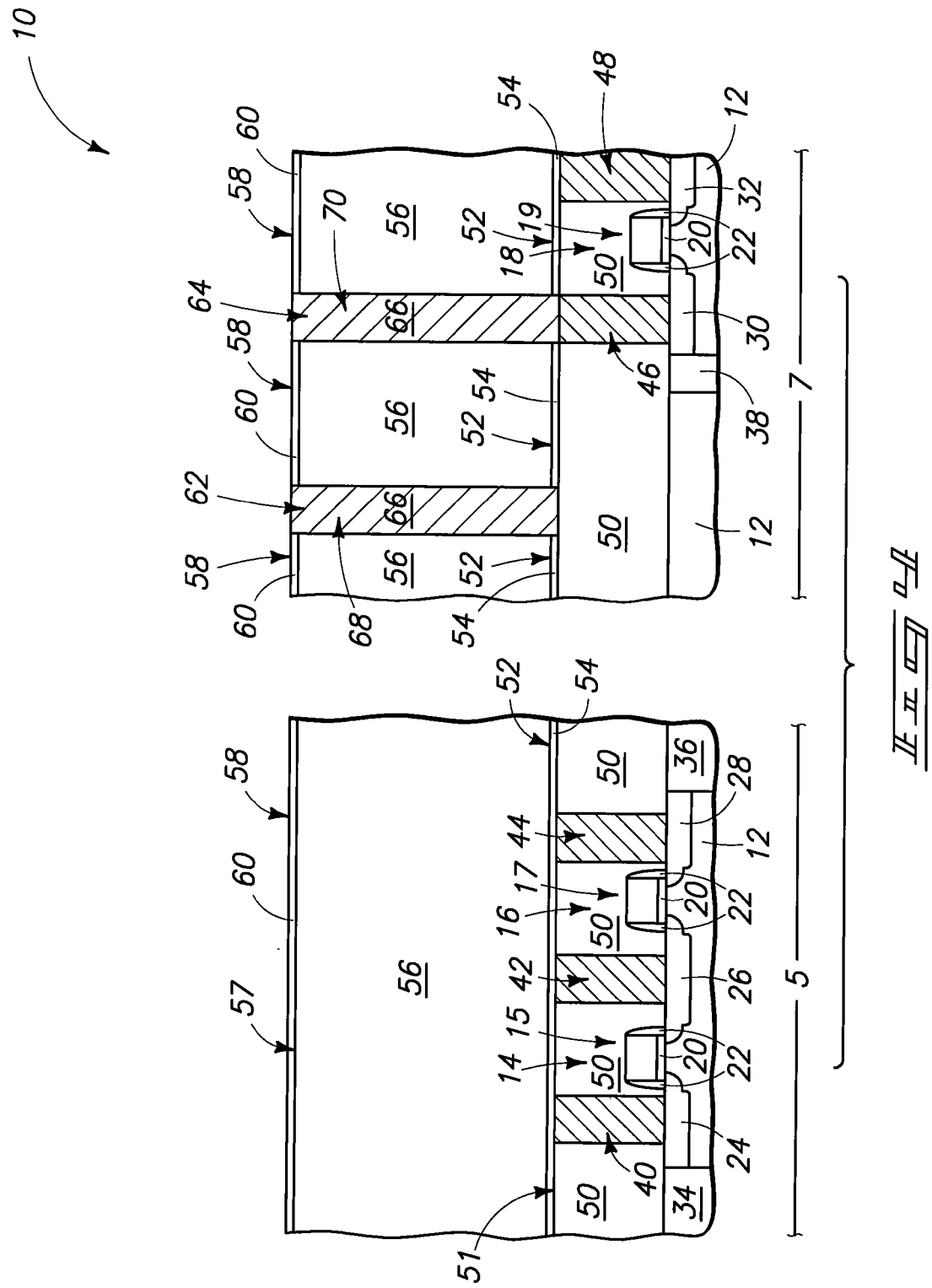

Referring to FIG. 4, material 66 is removed from over layer 58, and remains within openings 62 and 64 as electrically-conductive columns 68 and 70, respectively. The electrically conductive columns 68 and 70 may be referred to as peripheral structures.

Material 66 may be removed from over layer 58 by any suitable processing, including, for example, CMP. The layer 58 may function as an etch stop during the CMP to define locations of the uppermost remaining surfaces of columns 68 and 70 after the CMP.

The column 68 may be referred to as an interconnect, and may be one of a large plurality of identical interconnects simultaneously formed utilizing the processing of FIGS. 2-4.

Figure 5:
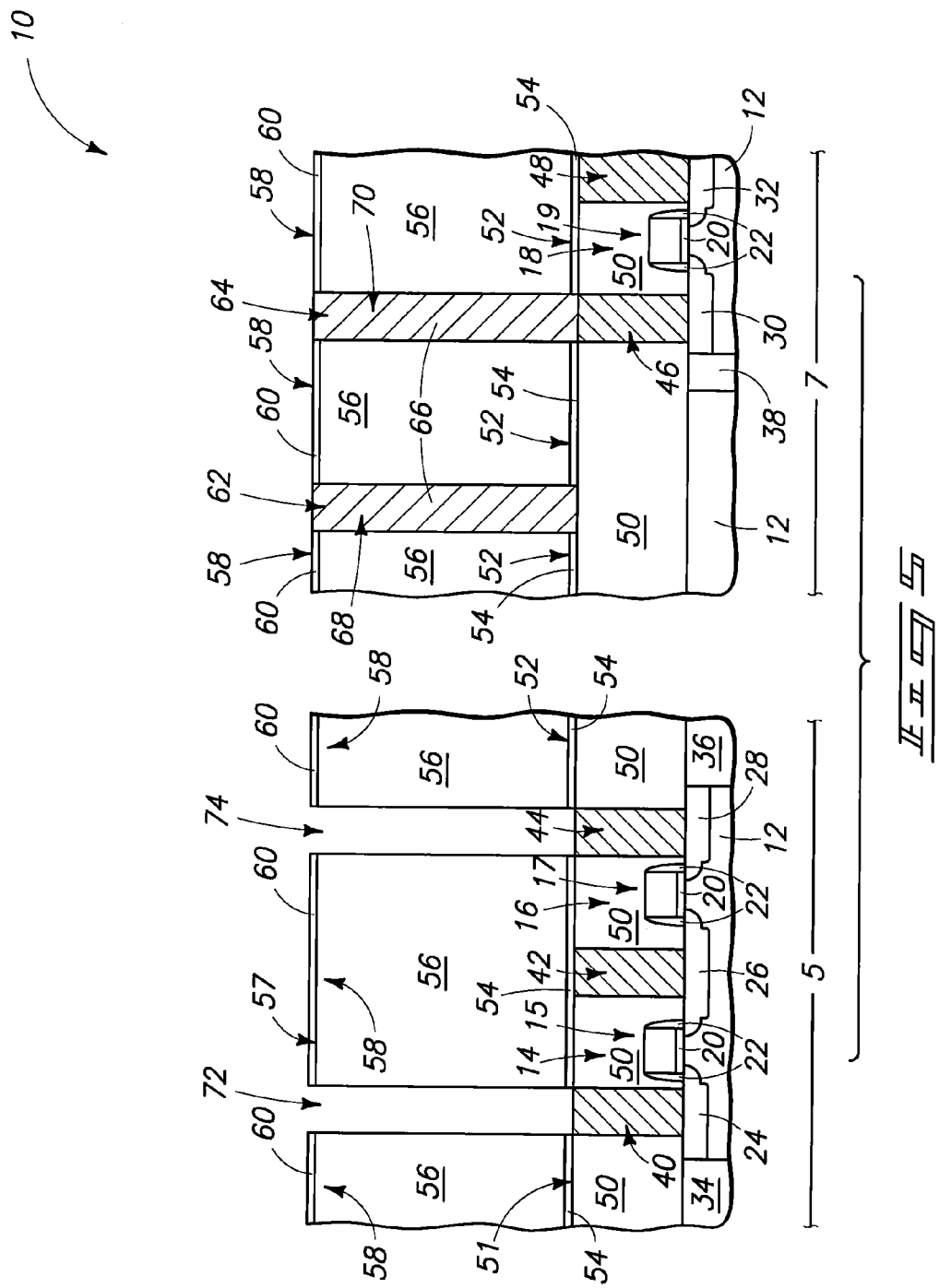

Referring to FIG. 5, openings 72 and 74 are formed over memory array region 5. Specifically, the openings are etched through materials 54, 56 and 60. The openings 72 and 74 extend to pedestals 40 and 44, respectively (in other words, extend to storage node contacts). Openings 72 and 74 may be referred to as a second openings to distinguish them from the first openings 62 and 64 (FIG. 2) formed over the peripheral region 7.

Openings 72 and 74 may be formed utilizing any suitable method. For instance, photolithographically-patterned photoresist (not shown) may be provided over material 60 to define locations of openings 72 and 74; a pattern may be transferred from the photoresist to underlying materials 54, 56 and 60 with one or more suitable etches; and the photoresist may then be removed to leave the shown construction of FIG. 5. The etches may be highly anisotropic. The openings 72 and 74 may be formed to be slightly wider than pedestals 40 and 44 in some embodiments (not shown) to compensate for possible mask misalignment. The etching of openings 72 and 74 may slightly over-etch into conductive material of pedestals 40 and 44 to ensure good electrical contact between the pedestals and conductive material formed in the openings.

Figure 6:
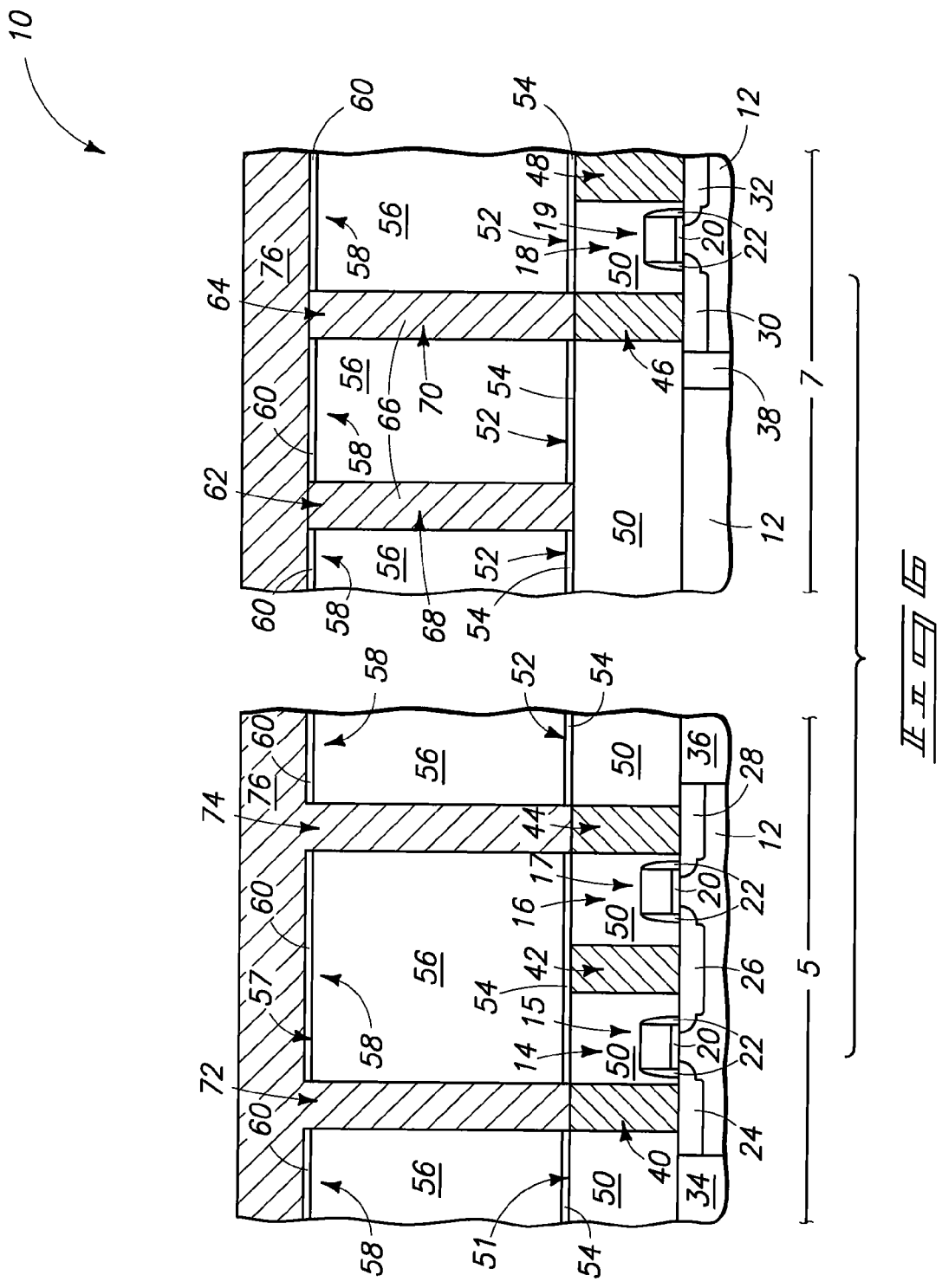

Referring to FIG. 6, electrically conductive material 76 is formed over layer 58 and within openings 72 and 74. Electrically conductive material 76 may comprise any suitable composition or combination of compositions; and may, for example, comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon). The electrically conductive material 76 within openings 72 and 74 may be referred so as capacitor storage node material.

Referring to FIG. 7, material 76 is removed from over layer 58, and remains within openings 72 and 74 as capacitor storage node pillars 78 and 80, respectively. Material 76 may be removed from over layer 58 by any suitable processing, including, for example, CMP. The storage node pillars 78 and 80 may be representative of a large plurality of identical storage node pillars simultaneously formed utilizing the processing of FIGS. 5-7.

The embodiment of FIGS. 2-7 forms the openings over the peripheral region 7 (openings 62 and 64 of FIG. 2) sequentially relative to the openings over the memory array region 5 (openings 72 and 74); and forms conductive material 66 within the openings over the peripheral region sequentially relative to formation of conductive material 76 within the openings over the memory array region. Such embodiment may be useful if it is desired to form the conductive columns over the peripheral region (columns 68 and 70) to comprise a different composition than the storage node pillars over the memory array region (storage node pillars 78 and 80). In other embodiments, the openings over the peripheral region may be formed simultaneously with the openings over the memory array region; and a common conductive material may be simultaneously formed within the openings over the memory array region and the openings over the peripheral region. In such other embodiments, the storage node pillars 78 and 80 will comprise the same composition as the columns 68 and 70 formed over the peripheral region. Even in embodiments in which the columns formed over the peripheral region are formed sequentially relative to the storage node pillars formed over the memory array region, the columns over the peripheral region may be identical in composition to the storage node pillars over the memory array region.

The embodiment of FIGS. 2-7 forms the columns 68 and 70 over the peripheral region 7 prior to formation of the storage node pillars 78 and 80 over the memory array region 5. In other embodiments, the storage node pillars may be formed prior to formation of the columns over the peripheral region.

Figure 8:
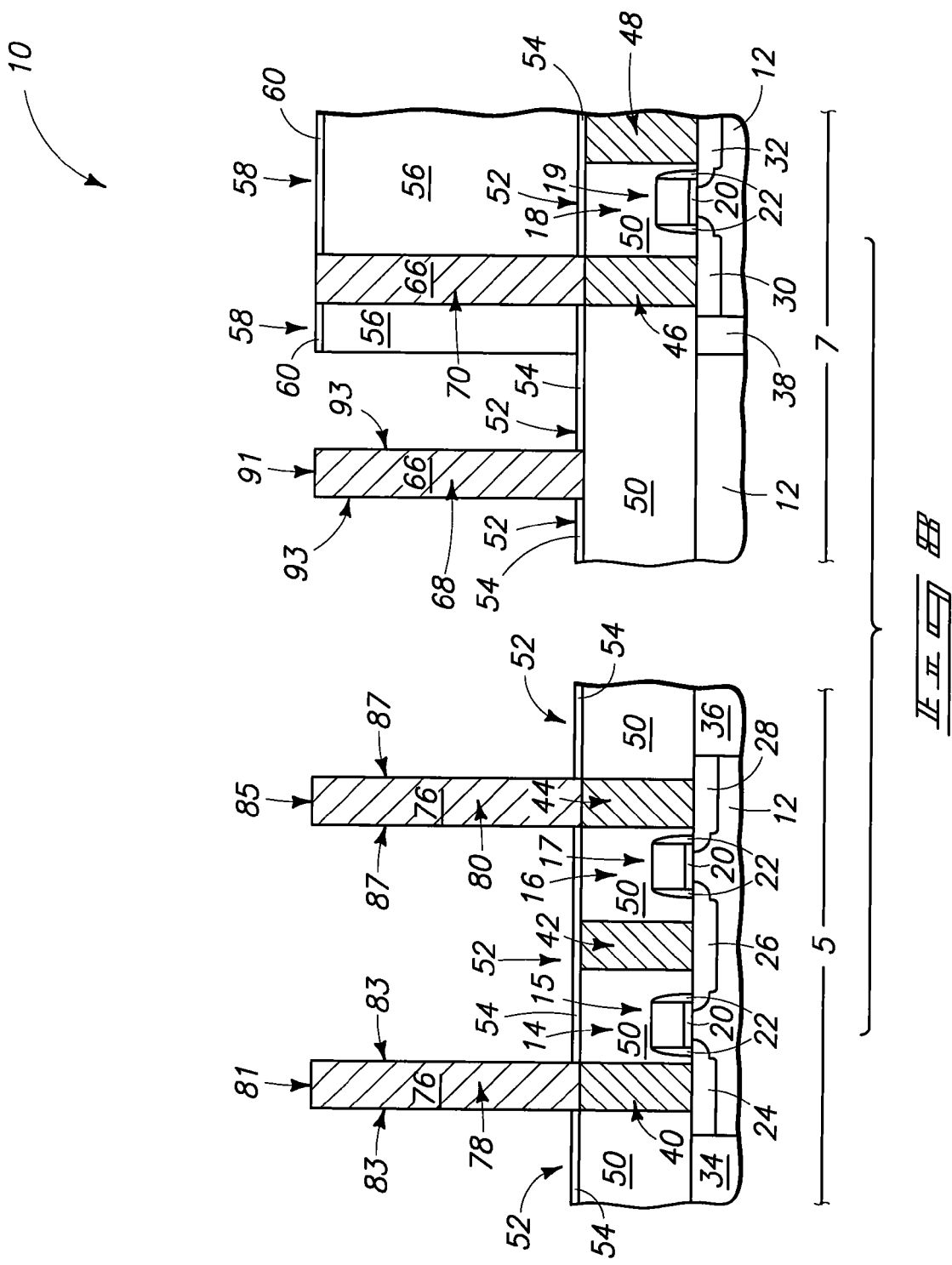

Referring to FIG. 8, portions of materials 56 and 60 are removed to leave surfaces of capacitor storage node pillars 78 and 80 exposed, and to leave surfaces of peripheral structure 68 exposed. Materials 56 and 60 remain along peripheral structure 70.

Materials 56 and 60 may be patterned and removed utilizing any suitable method. For instance, photolithographically-patterned photoresist (not shown) may be provided over material 60; a pattern may be transferred from the photoresist to underlying materials 56 and 60 with one or more suitable etches; and the photoresist may then be removed to leave the shown construction of FIG. 8.

Pillars 78, 80 and 68 may be self-supporting (as shown), or may be supported by one or more lattices, such as, for example, lattices analogous to those described in U.S. Pat. No. 7,271,051.

Protective material 54 may be utilized as an etch stop during removal of material 56. Specifically, etching conditions may be chosen which are selective for material 56 relative to material 54.

After removal of materials 56 and 60, storage node pillars 78 and 80 have exposed top surfaces 81 and 85, respectively; and have exposed sidewall surfaces 83 and 87, respectively. Also, peripheral structure 68 has an exposed top surface 91, and exposed sidewall surfaces 93.

Figure 9:
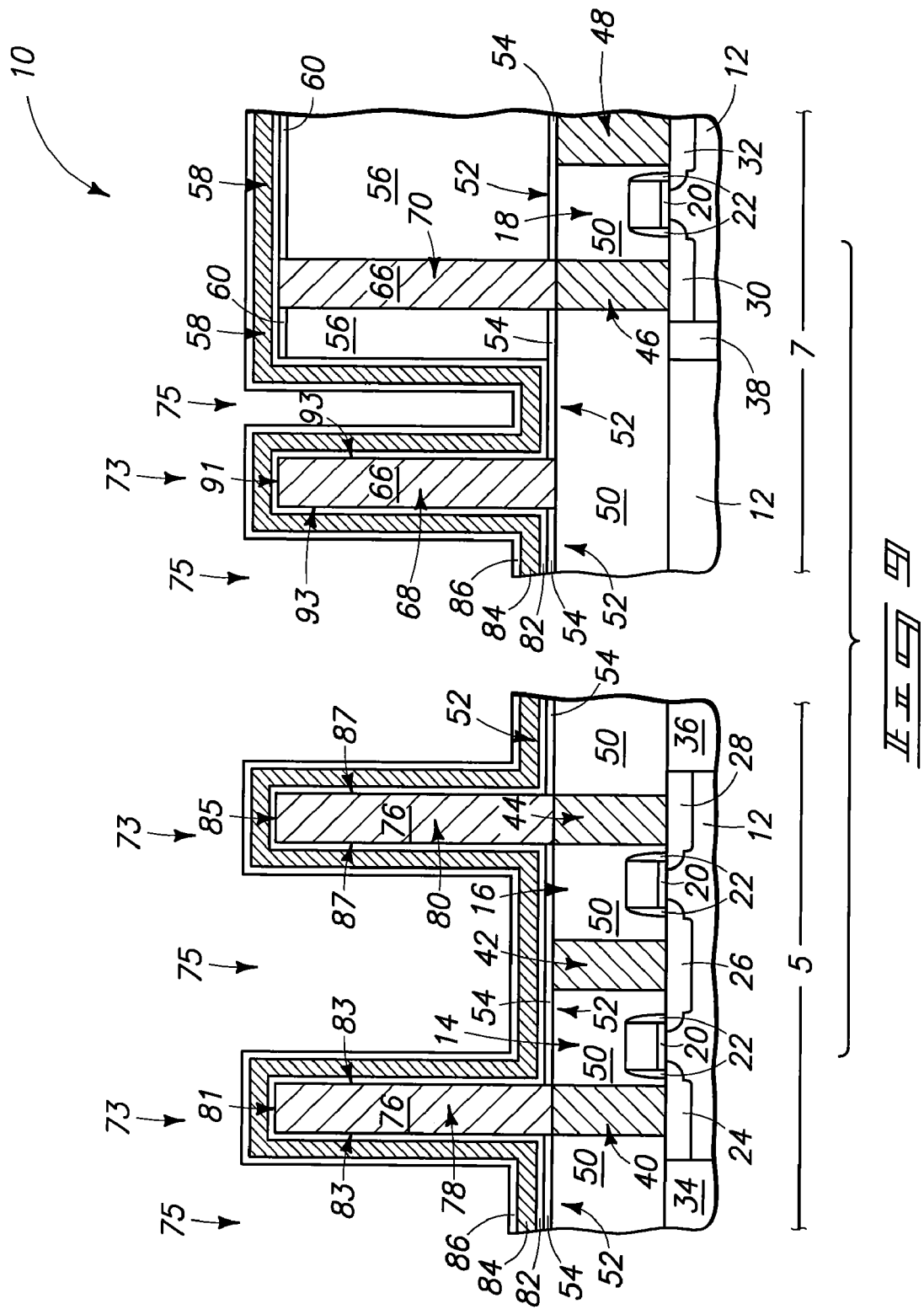

Referring to FIG. 9, dielectric material 82 is formed over the top surfaces 81 and 85 of storage node pillars 78 and 80, and along the sidewall surfaces 83 and 87 of the storage node pillars. The dielectric material 82 extends over peripheral region 7, and is formed to extend along the top surface 91 and sidewall surfaces 93 of peripheral structure 68. The dielectric material may comprise any suitable composition or combination of compositions; and may, for example, comprise one or more of silicon dioxide, silicon nitride, and various high-k compositions (with high-k compositions being compositions having a dielectric constant greater than that of silicon dioxide).

Dielectric material 82 may be formed by any suitable methodology, including, for example, one or more of ALD, CVD and PVD.

Capacitor plate material (which may also be referred to as outer electrode material) 84 is formed over dielectric material 82. The capacitor plate material extends across top surfaces 81, 85 and 91, and along sidewall surfaces 83, 87 and 93; and is spaced from the top and sidewall surfaces by dielectric material 82.

Capacitor plate material 84 may comprise any suitable composition or combination of compositions; and may, for example, comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon).

Capacitor plate material 84 may be formed by any suitable methodology, including, for example, one or more of ALD, CVD and PVD.

An etch stop material 86 is formed over capacitor plate material 84. Etch stop material 86 may comprise, for example, silicon nitride, and may be formed by ALD and/or low pressure CVD.

The pillars 78, 80 and 68, together with the materials 82, 84 and 86 extending conformally across the pillars, form a series of projections 73 having spaces 75 between them. The projections and spaces form an uneven topography across semiconductor base (or substrate) 12.

Figure 10:
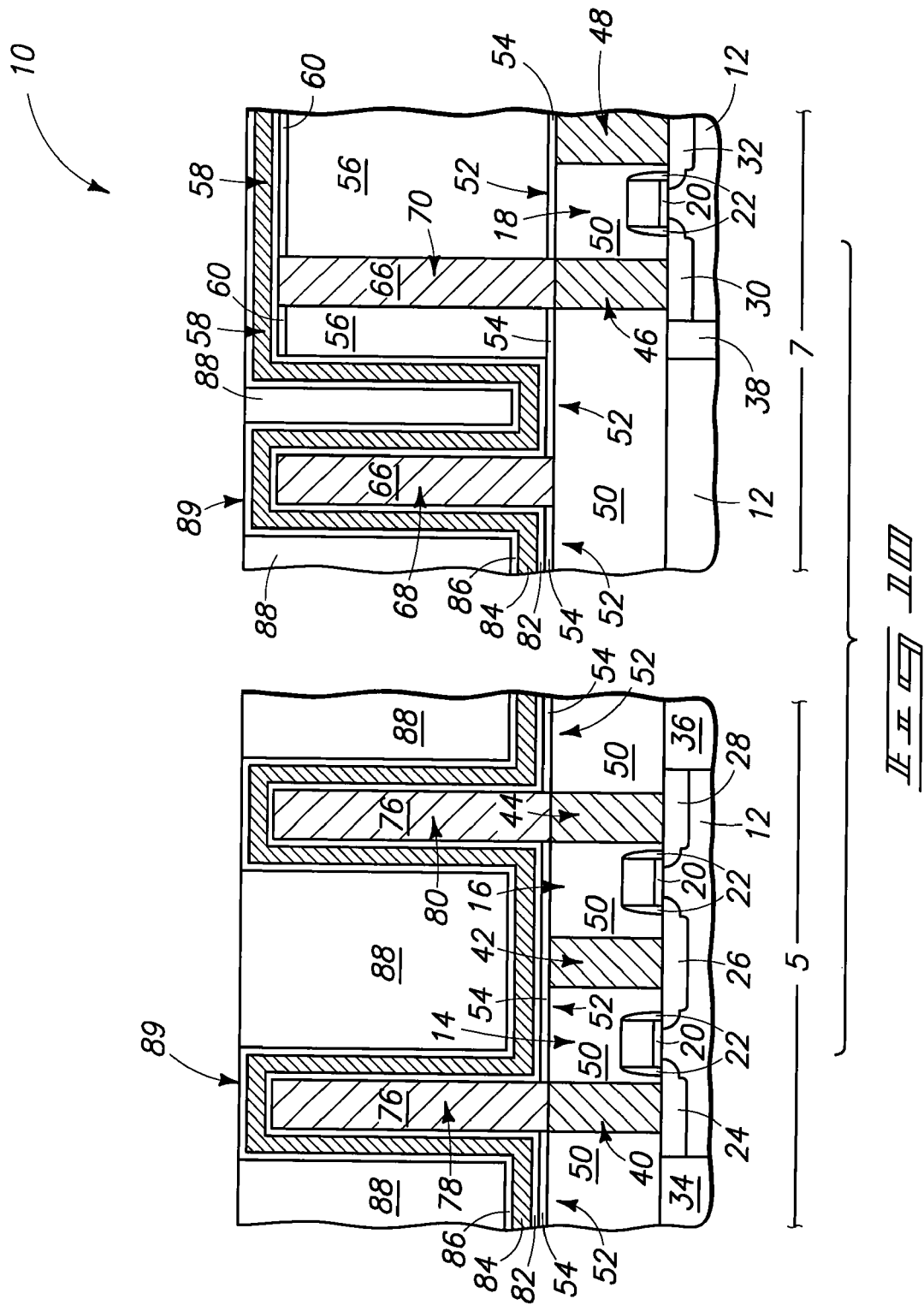

Referring to FIG. 10, a material 88 is formed over etch stop material 86. Material 88 may be referred to as a second material to distinguish it from the first material 56, and may comprise the same composition, or combination of compositions, as material 56. Material 88 is formed across the uneven topography of projections and spaces of FIG. 9.

A planarized surface 89 is shown extending over materials 88 and 86. Such planarized surface may be formed by initially forming material 88 to extend over material 86, and then utilizing CMP to remove material 88 from over etch stop material 86. The planarized surface 89 may be referred to as a third planarized upper surface to distinguish it from the second planarized upper surface 57 (FIG. 1). Planarized upper surface 89 defines an even topography extending across the material 88 and projections 73 (FIG. 9).

Figure 11:
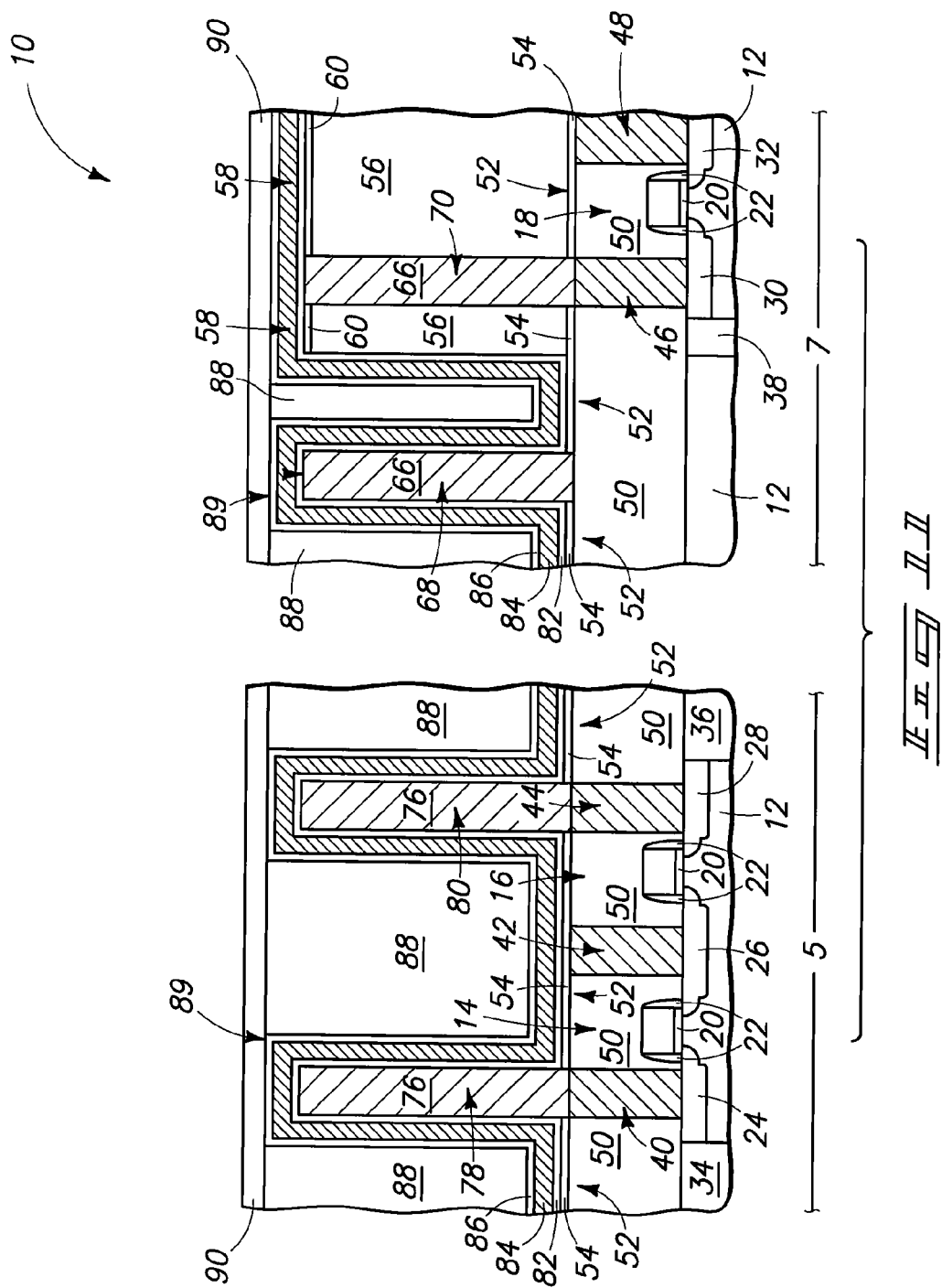

Referring to FIG. 11, a layer of etch stop material 90 is formed over planarized upper surface 89. Etch stop material 90 may comprise any suitable composition or combination of compositions, and may, for example, comprise, consist essentially of, or consist of silicon nitride. Etch stop material 90 is shown to be thicker than etch stop material 86; but may be about the same thickness as etch stop material 86, or thinner than etch stop material 86, in other embodiments.

Figure 12:
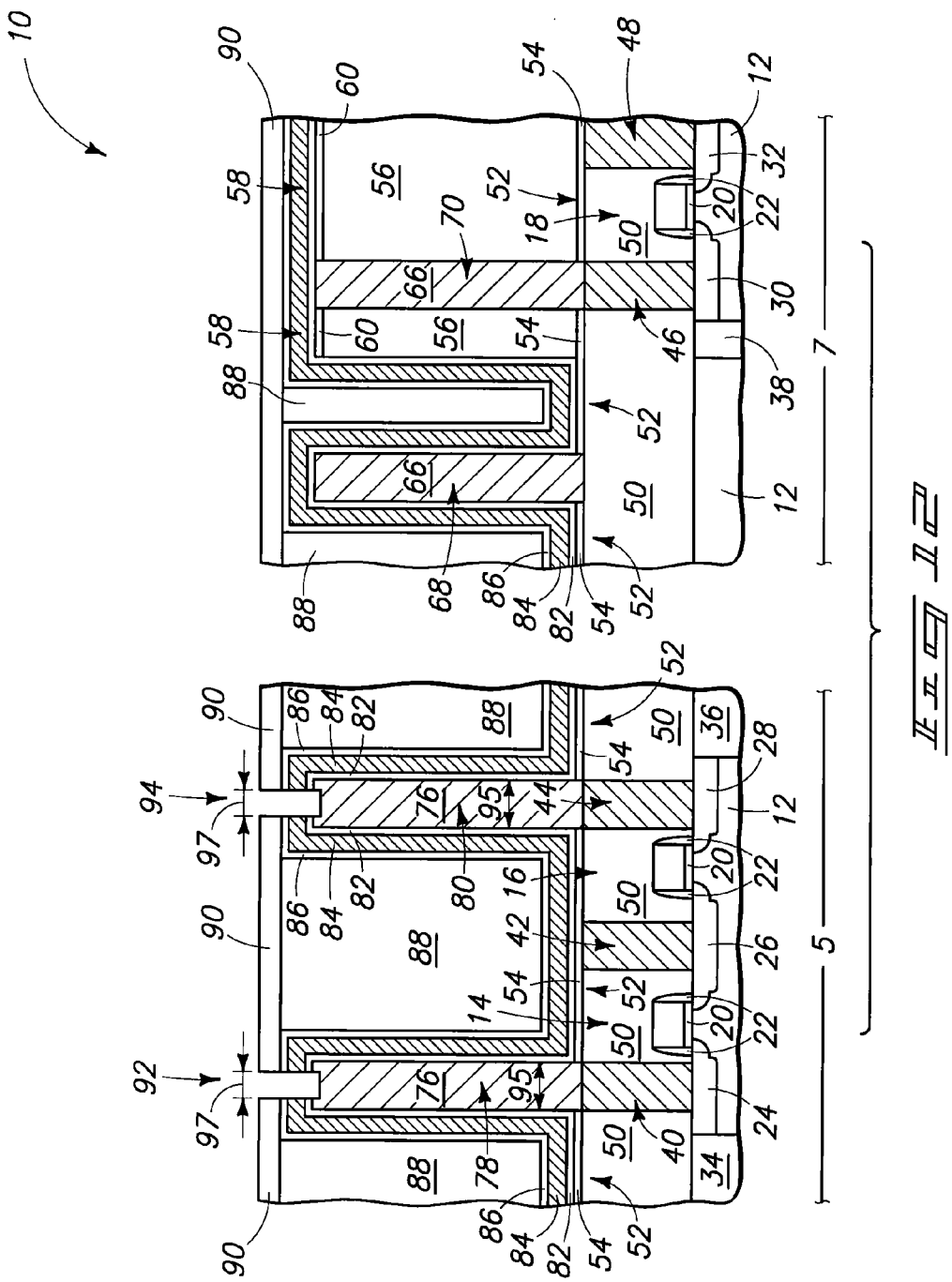

Referring to FIG. 12, apertures (or openings) 92 and 94 are formed through materials 82, 84, 86 and 90. The apertures extend to the capacitor storage node pillars 78 and 80, and in the shown embodiment are partially etched into conductive material 76 of the capacitor storage node pillars. The storage node pillars 78 and 80 are shown to comprise widths 95, and the openings 92 and 94 are shown to comprise widths 97 which are narrower than the widths 95 of the pillars. The narrower widths of openings 92 and 94 relative to widths of the storage node pillars may compensate for possible mask misalignment during formation of the openings over the storage node pillars.

Openings 92 and 94 may be formed by any suitable processing. For instance, photolithographically-patterned photoresist (not shown) may be provided over material 90; a pattern may be transferred from the photoresist to underlying materials 82, 84, 86 and 90 with one or more suitable etches; and the photoresist may then be removed to leave the shown construction of FIG. 12.

Figure 13:
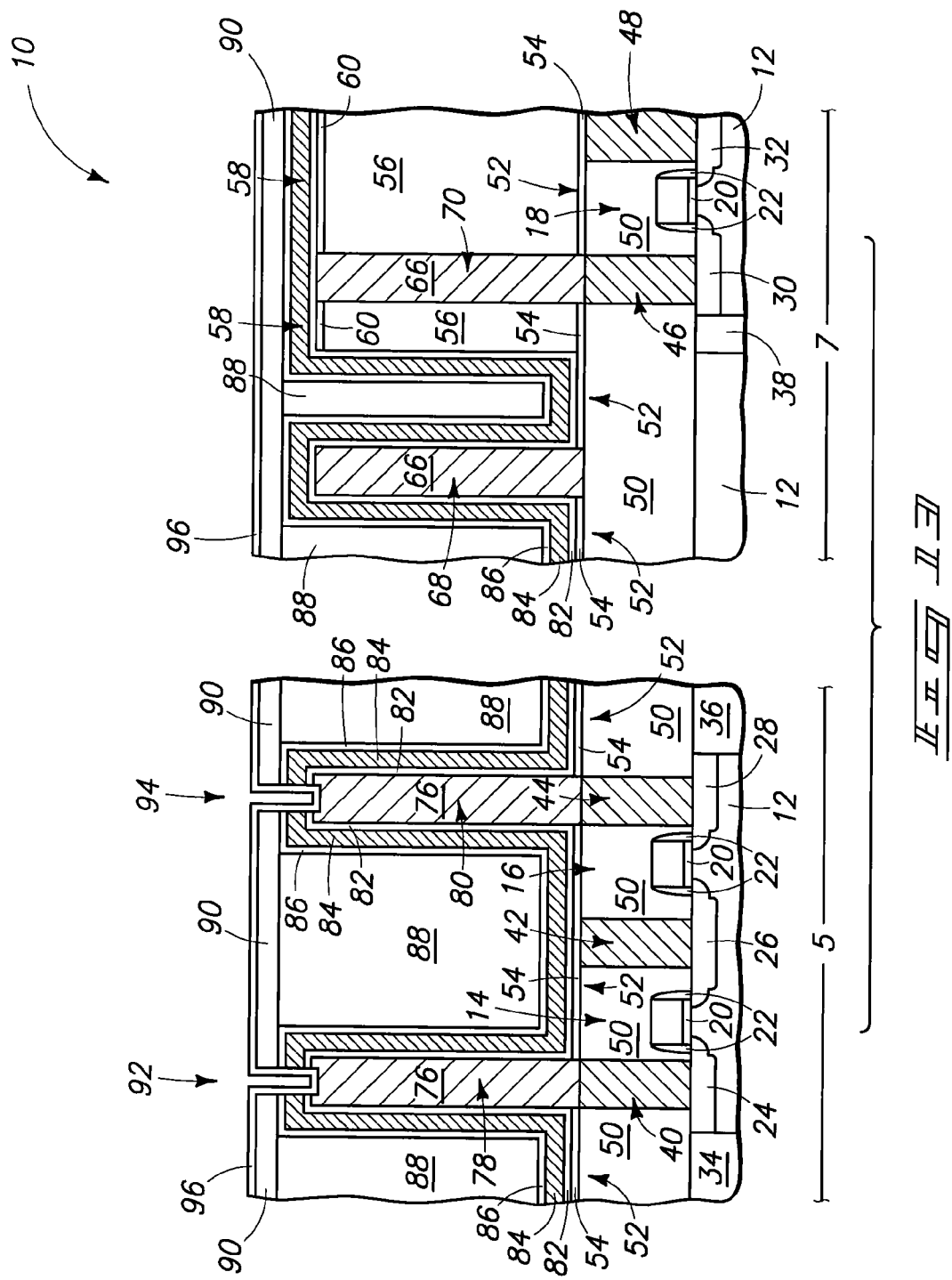

Referring to FIG. 13, an electrically insulative material 96 is formed over material 90 and within apertures 92 and 94. The insulative material 96 partially fills the apertures to narrow the apertures. Material 96 may, for example, comprise, consist essentially of, or consist of silicon nitride. Material 96 may be formed utilizing any suitable method, including, for example, one or more of CVD, ALD and PVD.

Figure 14:
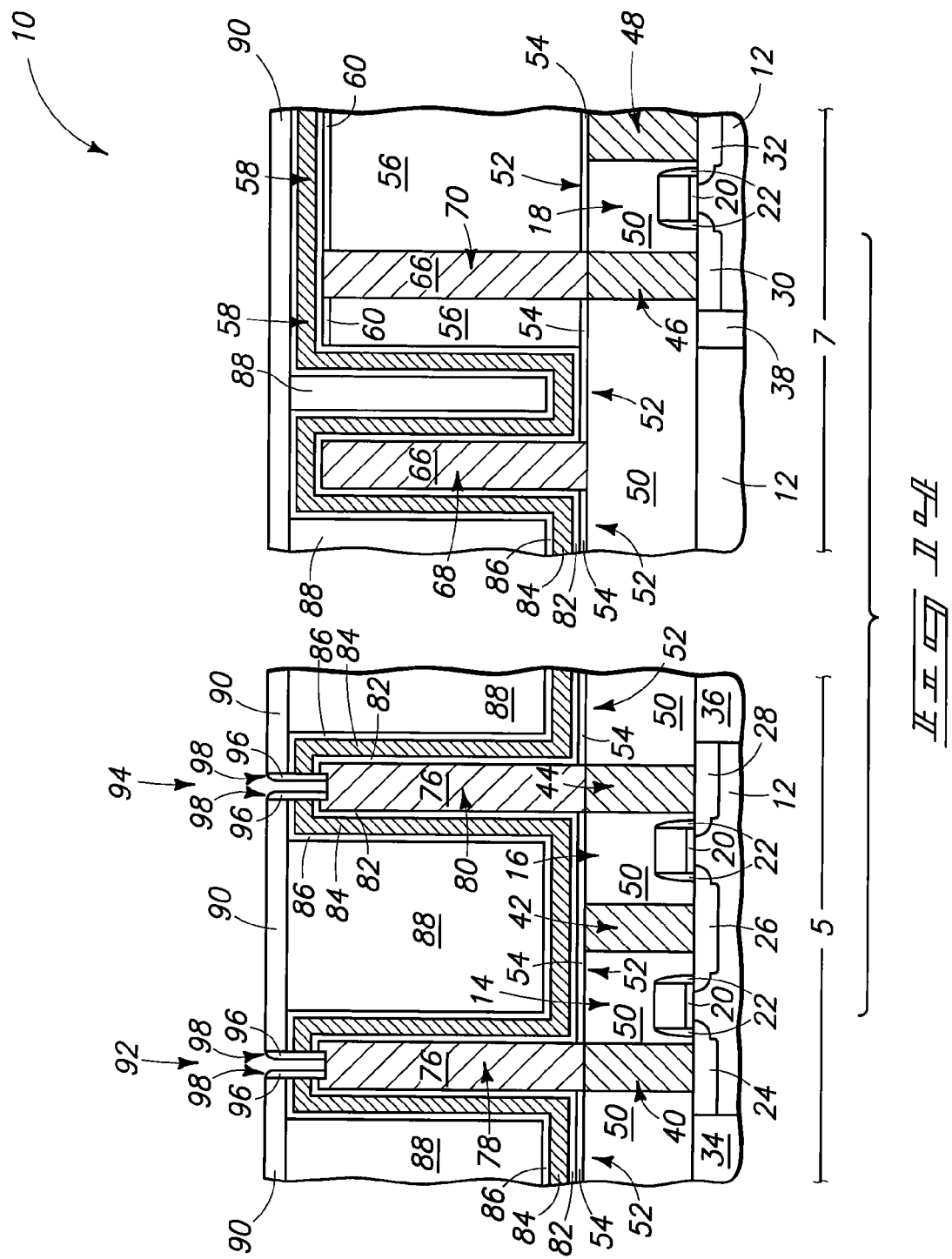

Referring to FIG. 14, material 96 is anisotropically etched to form spacers 98 within apertures 92 and 94. The spacers line sidewalls of the apertures, and leave capacitor storage node pillars 78 and 80 exposed at bottoms of the apertures. The spacers may be considered to form electrical isolation along capacitor plate material 84 so that such plate material does not become shorted to capacitor storage node pillars 70 and 80 when conductive material is provided in the apertures 92 and 94 in subsequent processing.

Figure 15:
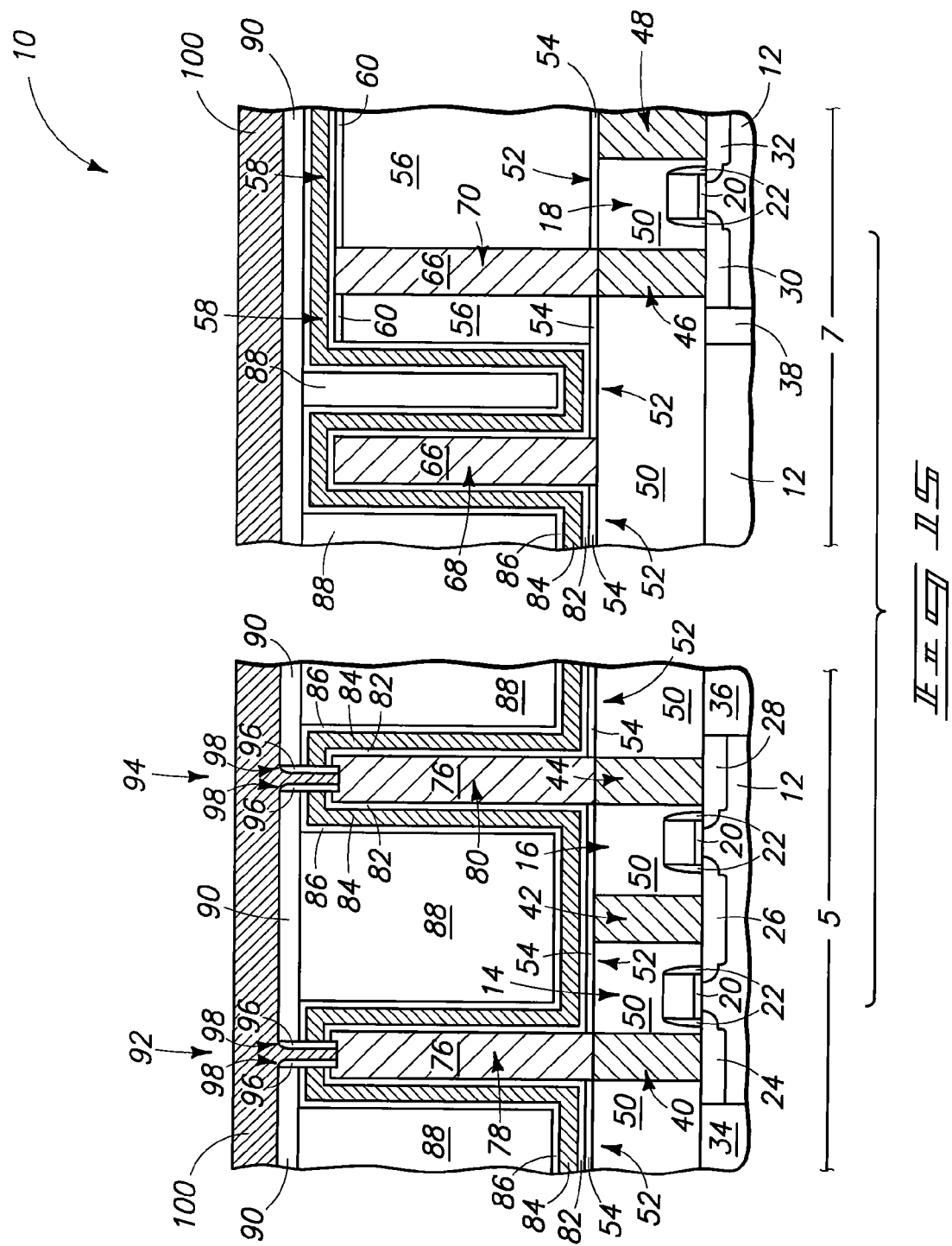

Referring to FIG. 15, node interconnect material 100 is formed over material 90 and within apertures 92 and 94. The node interconnect material is electrically conductive, and may comprise any suitable composition or combination of compositions. For instance, the node interconnect material may comprise one or more of various metals (for instance, tungsten, tantalum, titanium, etc.), metal-containing compositions (for instance, metal nitride, metal silicides, etc.) and conductively-doped semiconductor materials (for instance, conductively-doped silicon). The node interconnect material 100 may be formed by any suitable processing, including, for example, one or more of ALD, CVD and PVD.

Figure 16:
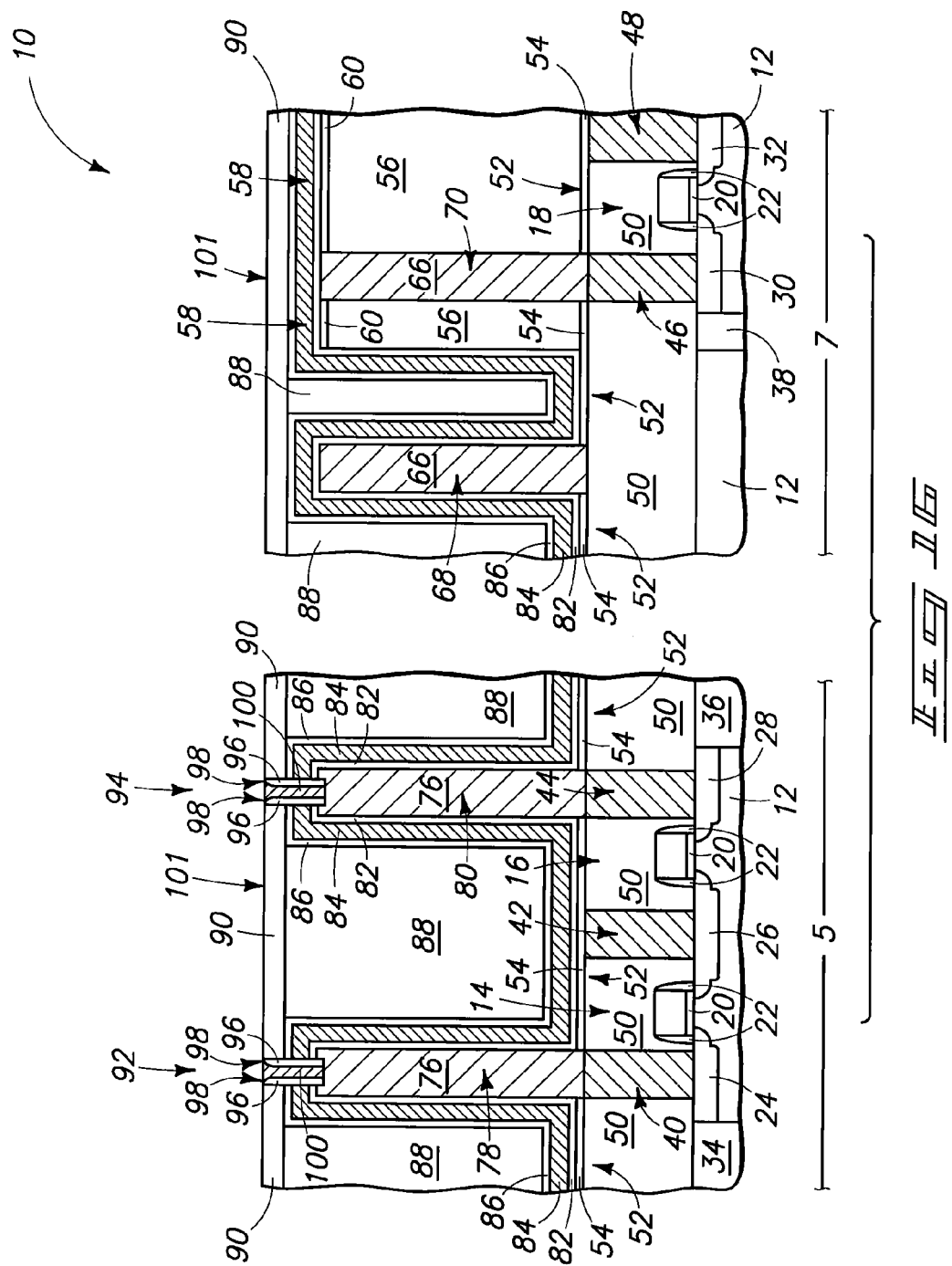
Figure 11H:
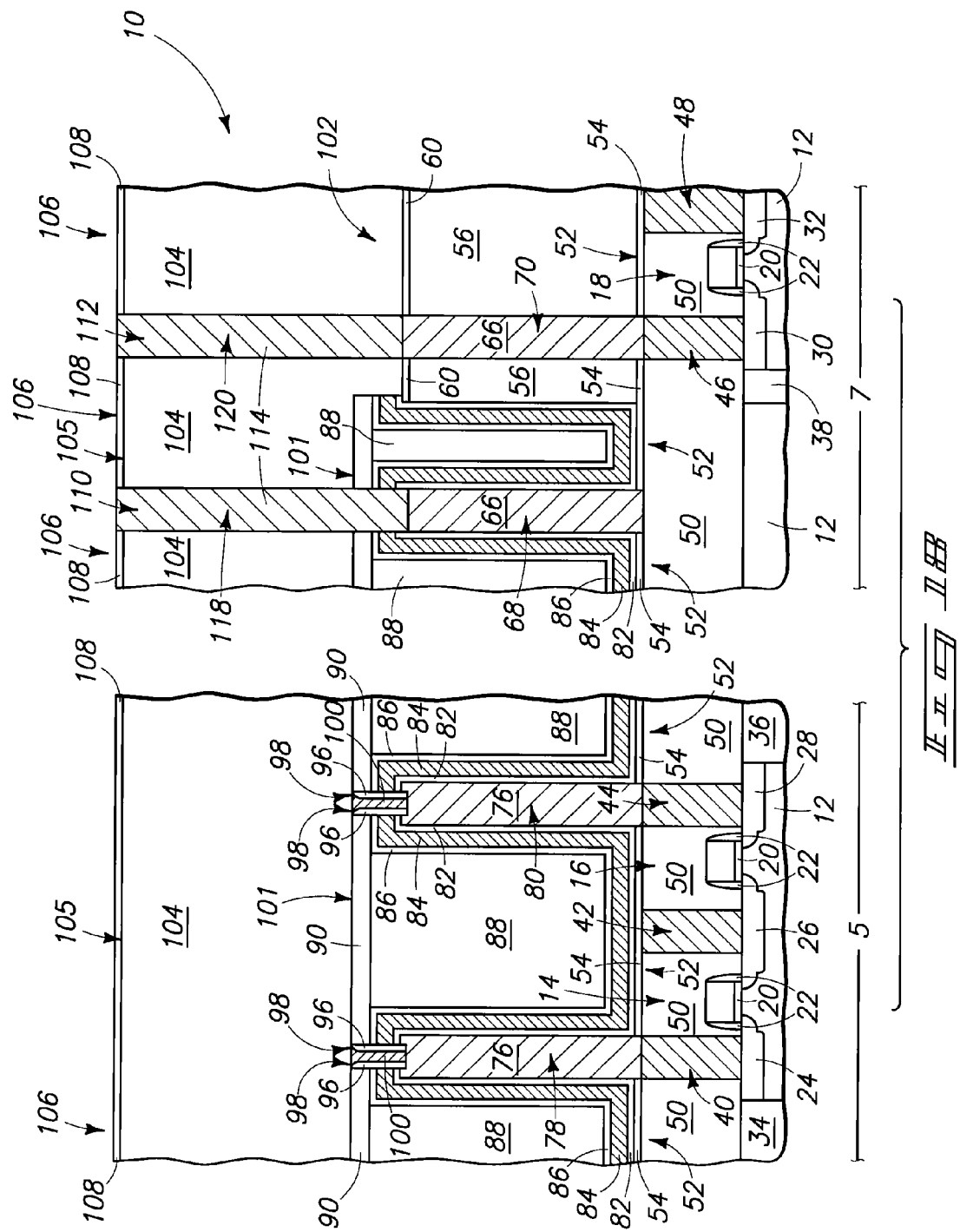

Referring to FIG. 16, node interconnect material 100 is removed from over etch stop material 90, while leaving the node interconnect material within apertures 92 and 94. The removal of the node interconnect material may comprise CMP, and may form a planarized upper surface 101 extending across the node interconnect material 100 and the etch stop material 90. Planarized surface 101 may be referred to as a fourth planarized upper surface to distinguish it from the third planarized upper surface 89 (FIG. 10).

Referring to FIG. 17, portions of materials 82, 84, 86 and 90 are removed from over etch stop 60 across peripheral region 7 to form an inset, or step, 102 extending to conductive column 70. Such exposes column 70 for subsequent attachment to other circuitry formed over column 70. Step 102 may be patterned utilizing any suitable processing. For instance, photolithographically-patterned photoresist (not shown) may be provided over material 90; a pattern may be transferred from the photoresist to underlying materials 82, 84, 86 and 90 with one or more suitable etches; and the photoresist may then be removed to leave the shown construction of FIG. 17. In some embodiments (not shown) the etch of FIG. 17 may extend through etch stop 60.

Referring to FIG. 18, a material 104 is formed over planarized surface 101 and within step 102. Material 104 may be referred to as a third material to distinguish it from the second material 88, and may comprise the same composition, or combination of compositions, as material 88.

Material 104 comprises a planarized upper surface 105 thereover. Such planarized surface may be formed reflowing material 104 during formation of the material, and/or by utilizing CMP. The planarized surface 105 may be referred to as a fifth planarized upper surface to distinguish it from the fourth planarized upper surface 101 (FIG. 16). Material 104 may be referred to as a second template material in that openings are ultimately formed in material 104 to create a template for fabrication of second modules, or segments, of capacitor storage nodes. The thickness of material 104 determines a thickness of the second modules of the capacitors.

An etch stop layer 106 is formed over material 104. Etch stop layer 106 comprises a material 108. The material 108 may comprise any suitable composition or combination of compositions, and may, for example, comprise, consist essentially of, or consist of silicon nitride.

The etch stop layer 106 and third material 104 may be formed utilizing processing analogous to that described in FIG. 1 for forming etch stop layer 60 and first material 56.

Openings 110 and 112 are formed through materials 104 and 108 over peripheral region 7, and filled with conductive material 114. The openings 110 and 112 may be referred to as third openings to distinguish such opening from the first openings 62 and 64 of FIG. 2, and the second openings 72 and 74 of FIG. 5. The conductive material 114 may be referred to as second interconnect material to distinguish it from the first interconnect material 66 of FIG. 3.

The openings 110 and 112 extend to the first peripheral structure 68, and the conductive column 70, respectively. The conductive material 114 within opening 110 forms a second peripheral structure 118 over and in electrical connection with the first peripheral structure 68, and also in electrical connection with the capacitor plate material 84. The conductive material 114 within opening 112 forms an electrical interconnect 120 extending to conductive column 70.

The openings 110 and 112 extending through materials 104 and 108 may be formed utilizing processing analogous to that described with reference to FIG. 2 for forming openings 62 and 64. The conductive material 114 may be formed within openings 110 and 112 utilizing processing analogous to that described in FIGS. 3 and 4 for forming conductive material 66 within openings 62 and 64. The conductive material 114 may be identical in composition to the conductive material 66 in some embodiments, and may be different in composition from conductive material 66 in other embodiments.

Referring to FIG. 19, openings 122 and 124 are formed through materials 104 and 108 over memory array region 5, and filled with conductive material 126. The openings 122 and 124 may be referred to as a fourth openings to distinguish such openings from the first openings 62 and 64 of FIG. 2, the second openings 72 and 74 of FIG. 5, and the third openings 110 and 112 of FIG. 18. The conductive material 126 may be referred to as second capacitor storage node material to distinguish it from the first capacitor storage node material 76 of FIG. 6.

The openings 122 and 124 extend to the node interconnect material 100 that is over the capacitor storage node pillars 78 and 80, respectively. The conductive material 126 within openings 122 and 124 forms second capacitor storage node pillars 128 and 130 over and in electrical connection with the first capacitor storage node pillars 78 and 80. In some embodiments, the storage node pillars 78 and 80 may be considered to be first segments of a capacitor storage node; and the interconnect material 100, together with the storage node pillars 128 and 130, may be considered to be second segments of the capacitor storage node.

The openings 122 and 124 extending through materials 104 and 108 may be formed utilizing processing analogous to that described with reference to FIG. 5 for forming openings 72 and 74. The conductive material 126 may be formed within openings 122 and 124 utilizing processing analogous to that described in FIGS. 6 and 7 for forming conductive material 76 within openings 72 and 74. The conductive material 126 utilized for the second capacitor storage node pillars 128 and 130 may be identical in composition to the conductive material 76 utilized for the first capacitor storage node pillars 78 and 80 in some embodiments, and may be different in composition from conductive material 76 in other embodiments.

The embodiment of FIGS. 18 and 19 forms the openings over the peripheral region 7 (openings 110 and 112 of FIG. 18) sequentially relative to the openings over the memory array region 5 (openings 122 and 124); and forms conductive material 114 within the openings over the peripheral region sequentially relative to formation of conductive material 126 within the openings over the memory array region. Such embodiment may be useful if it is desired to form the conductive columns over the peripheral region (columns 118 and 120) to comprise a different composition than the storage node pillars over the memory array region (storage node pillars 128 and 130). In other embodiments, the openings over the peripheral region may be formed simultaneously with the openings over the memory array region; and a common conductive material may be simultaneously formed within the openings over the memory array region and the openings over the peripheral region. In such other embodiments, the storage node pillars 128 and 130 will comprise the same composition as the columns 118 and 120 formed over the peripheral region. Even in embodiments in which the columns formed over the peripheral region are formed sequentially relative to the storage node pillars formed over the memory array region, the columns over the peripheral region may be identical in composition to the storage node pillars over the memory array region.

The embodiment of FIGS. 18 and 19 forms the columns 118 and 120 over the peripheral region 7 prior to formation of the storage node pillars 128 and 130 over the memory array region 5. In other embodiments, the storage node pillars may be formed prior to formation of the columns over the peripheral region.

Figure 20:
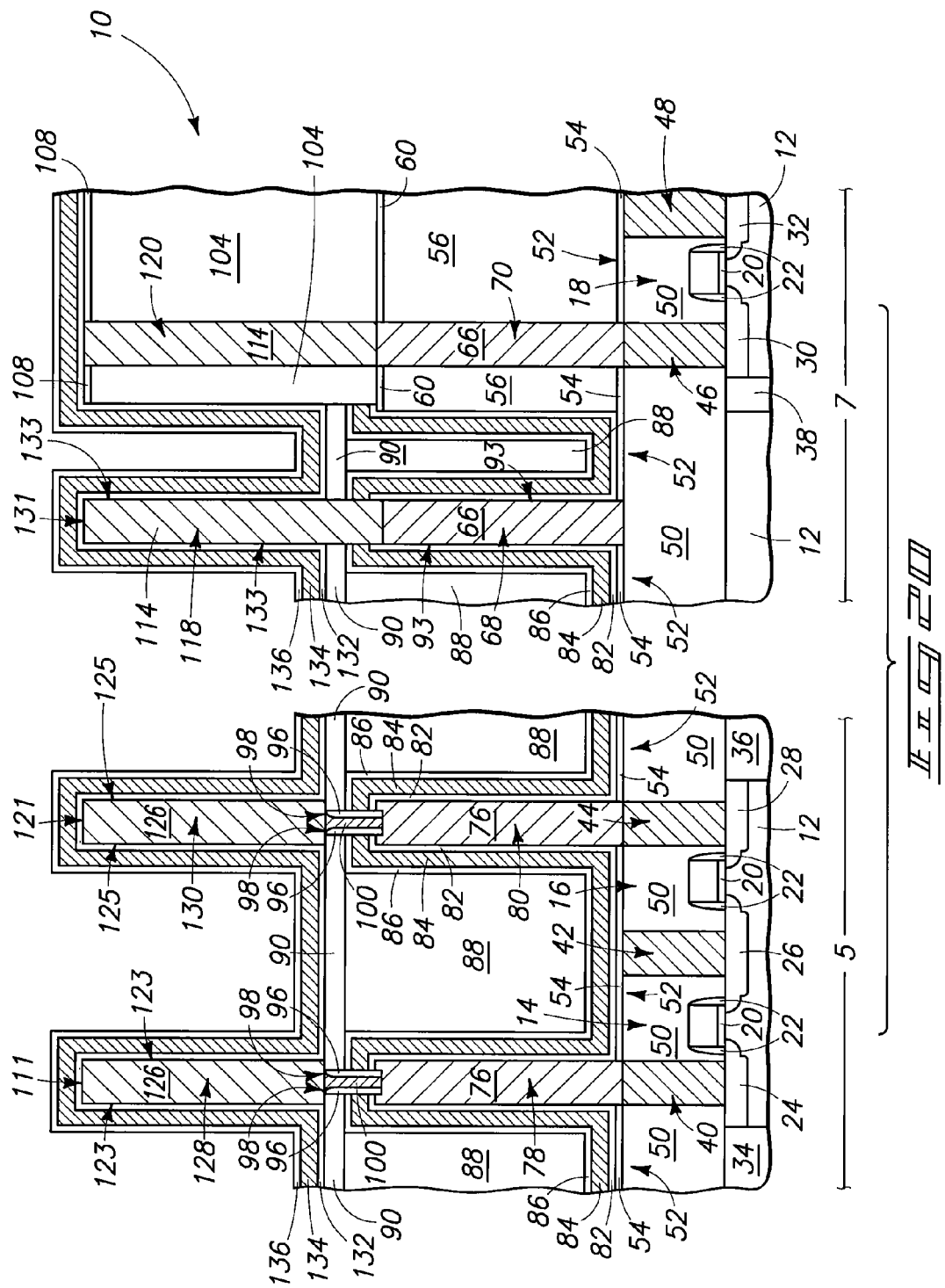

Referring to FIG. 20, materials 104 and 108 are patterned analogously to the patterning of materials 56 and 60 described with reference to FIG. 8. The patterning of materials 104 and 108 leaves surfaces of capacitor storage node pillars 128 and 130 exposed, and leaves surfaces of peripheral structure 118 exposed, analogous to the exposed surfaces shown in FIG. 8 relative to pillars 78 and 80, and to peripheral structure 68. Specifically, the storage node pillars 128 and 130 will have exposed top surfaces 111 and 121, respectively; and will have exposed sidewall surfaces 123 and 125, respectively. Also, peripheral structure 118 will have an exposed upper surface 131, and exposed sidewall surfaces 133.

Dielectric material 132 is formed over the top surfaces 111 and 121 of storage node pillars 128 and 130, and along the sidewall surfaces 123 and 125 of the storage node pillars. The dielectric material 132 extends over peripheral region 7, and is formed to extend along the top surface 131 and sidewall surfaces 133 of peripheral structure 118. The dielectric material 132 may be identical to the dielectric material 82 described with reference to FIG. 9. Dielectric material 132 may be referred to as a second dielectric material to distinguish it from the first dielectric material 82 of FIG. 9.

Capacitor plate material (which may also be referred to as outer electrode material) 134 is formed over dielectric material 132, and an etch stop material 136 is formed over capacitor plate material 134. The capacitor plate material 134 and the etch stop material 136 may be identical to the capacitor plate material 84 and the etch stop material 86, respectively, of FIG. 9. Capacitor plate material 134 and etch stop material 136 may be referred to as second capacitor plate material and second etch stop material to distinguish them from the first capacitor plate material 84 and first etch stop material 86 of FIG. 9.

Figure 21:
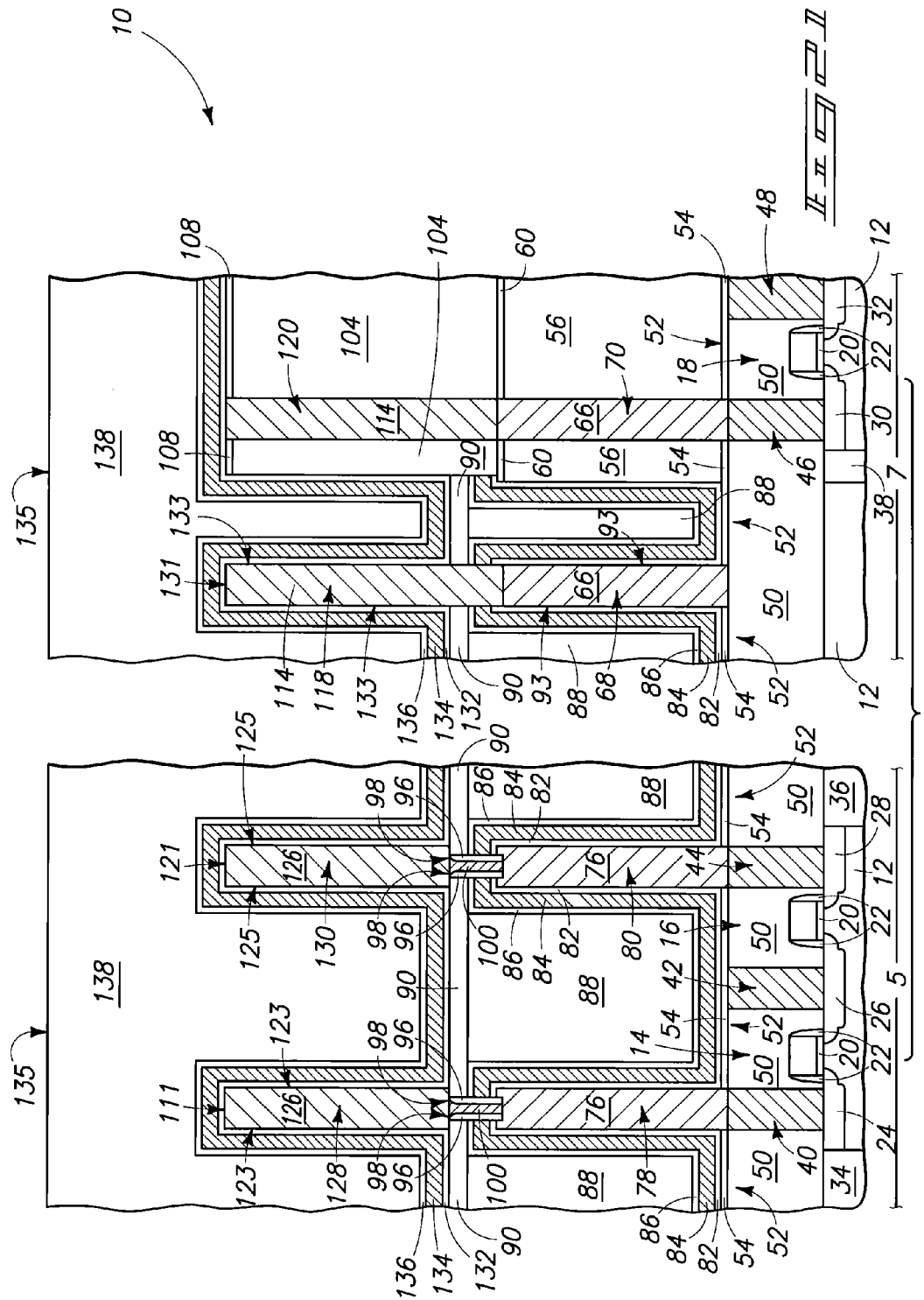

Referring to FIG. 21, a material 138 is formed over etch stop material 136. Material 138 may be referred to as a fourth material to distinguish it from the first, second and third materials 56, 88 and 104; and may comprise the same composition, or combination of compositions, as one or more of materials 56, 88 and 104.

A planarized surface 135 is shown extending over material 138. Such planarized surface may be formed by utilizing reflow of material 138 and/or CMP.

Referring to FIG. 22, an opening 140 is formed to extend through material 138, and layers 132, 134 and 136. Opening 140 extends to peripheral structure 118. Conductive material 142 is formed within opening 140 to form an interconnect (or peripheral structure) 144 that extends to peripheral structure 118. Also, an electrical interconnect 201 is formed to extend through material 138 to electrically connect with interconnect 120. Interconnect 201 may be formed with processing analogous to that described above for forming interconnect 120; and may be formed simultaneously with peripheral structure 144.

Peripheral structures 144, 118 and 68 electrically connect to one another, and electrically connect to capacitor plates 134 and 84. Thus, the peripheral structures interconnect capacitor plates 134 and 84 to one another. The peripheral structure 144 may be utilized to electrically connect the capacitor plates to other circuitry (not shown) utilized to provide and/or control voltage on the plates. Peripheral structures 144, 118 and 68 are the same lateral thickness as one another, as would occur if the peripheral structures were all patterned utilizing the same photomask. In other embodiments, one or more of the peripheral structures 144, 118 and 68 may be a different lateral thickness than another of the peripheral structures.

Figure 23:
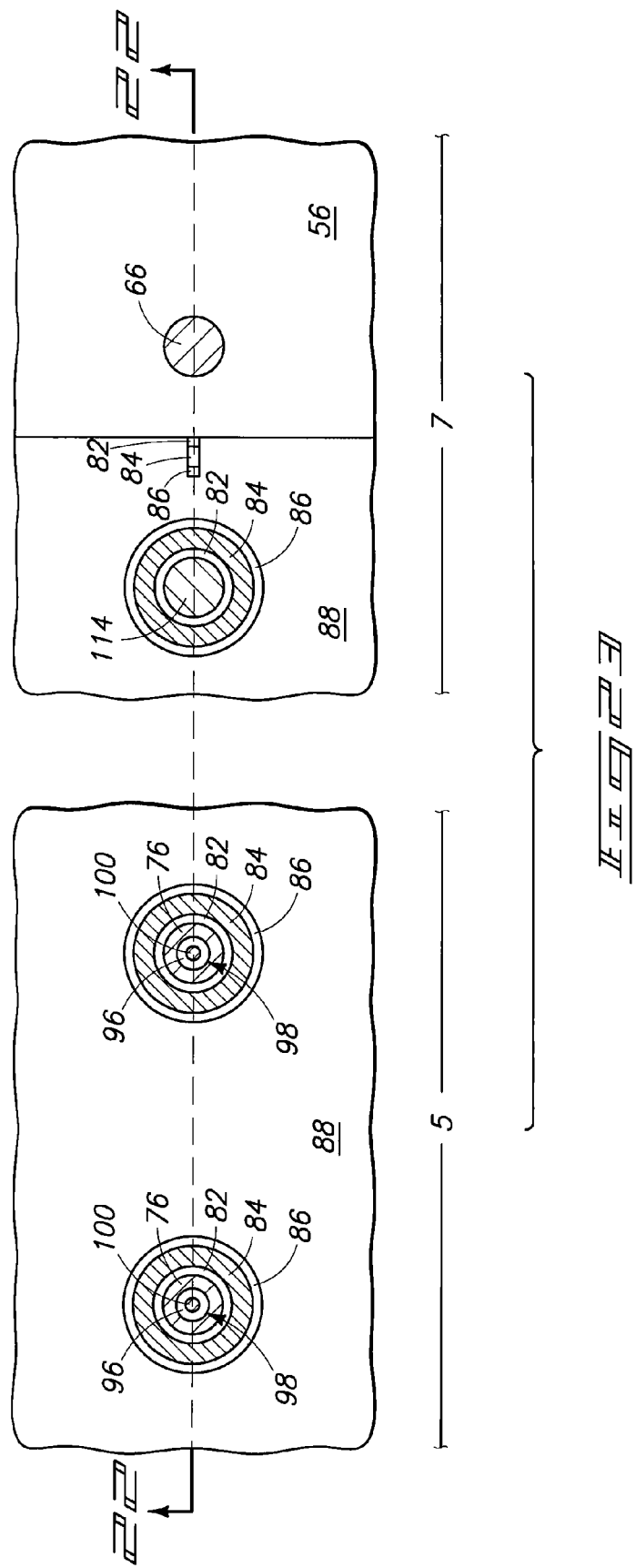
FIG. 23 is a view along the line 23-23 of FIG. 22, and the view of FIG. 22 is along the line 22-22 of FIG. 23.

FIG. 23 shows a view of the construction of FIG. 22 along the cross-section 23-23. The cross-section of FIG. 23 shows that capacitor plate material 84 encircles spacers 98 so that capacitor plate material is continuous around the capacitor storage node pillars 78 and 80.

The storage node pillars 78 and 80 may be considered to be first storage node segments or sections. Such storage node segments, in combination with the capacitor dielectric material 82 and capacitor plate material 84 surrounding the segments, may be considered to form first capacitor modules. The storage node pillars 128 and 130 may be considered to be second storage node segments (or sections) which are electrically connected to the first storage node segments through interconnect material 100. The second storage node segments, together with the dielectric material 132 and capacitor plate material 134 surrounding such segments, may be considered to form second capacitor modules.

An individual first capacitor module, together with an individual second capacitor module that is directly over the first capacitor module, forms a capacitor construction. Thus, the first capacitor module containing storage node pillar 78, together with the second capacitor module containing storage node pillar 128 forms a capacitor construction 150; and the capacitor module containing storage node pillar 80 together with the second capacitor module containing storage node pillar 130 forms a capacitor construction 152. The capacitor constructions contain capacitor plate materials 84 and 134 that interconnect with one another over peripheral region 7 through peripheral structures 68, 118 and 144.

In the shown embodiment, the first capacitor storage node pillars comprise widths (in other words, lateral thicknesses) 95, the second capacitor storage node pillars comprise widths 155 that are about the same as the widths 95, and the interconnecting regions between the first and second capacitor storage node pillars (in other words, the regions comprising interconnect material 100) comprise widths 97 that are less than the widths 95 and 155. The capacitors may thus be considered to comprise two thick storage node pillars (for instance, the thick storage node pillars 78 and 128) that are connected to one another through a narrow neck region (for instance, a neck region 160 between the thick storage node pillars 78 and 128). In the shown embodiment, the dielectric material 82 and capacitor plate material 84 extend along the first thick storage node pillar 78, but not along the second thick storage node pillar 128; and similarly the dielectric material 132 and capacitor plate material 134 extend along the second thick storage node pillar 128, but not along the first thick storage node pillar 78.

The first and second thick pillars of a capacitor construction may be the same in composition as one another in some embodiments, and may be different in composition from one another in other embodiments. Also, the narrow neck region between the thick pillars may be the same in composition as one or both of the thick pillars, or may differ in composition from both of the thick pillars. In some embodiments, the first and second thick pillars, together with the narrow neck region interconnecting them, may be considered to be a capacitor storage node.

The capacitor plate materials 84 and 134 can be considered to interconnect with one another at an interconnect region over the peripheral region 7. In the shown embodiment, the interconnect region comprises a first pillar 68 which is electrically connected with a second pillar 114 directly over the first pillar. The first pillar has a sidewall 93, and the dielectric material 82 extends along such sidewall. The second pillar has a sidewall 133, and the dielectric material 132 extends along such sidewall. Capacitor plate material 84 is separated from sidewall 93 of the first pillar by the dielectric material 82, and similarly capacitor plate material 134 is separated from sidewall 133 of pillar 118 by dielectric material 132.

In some embodiments, pillars 68 and 118 may be considered to be conductive interconnects over the peripheral region, and the capacitor plate materials 84 and 134 may be considered to comprise lines that extend from the memory array region to the conductive interconnects over the peripheral region. In the shown embodiment, the capacitor dielectric materials 82 and 132 also extend from the memory array region to the peripheral region, and physically contact the pillars 68 and 118.

An electrical interconnect corresponding to a portion of the second pillar 114 breaches across dielectric material 82 to provide connection between first pillar 68 and capacitor plate material 84; and similarly an electrical interconnect corresponding to conductive material 142 breaches across dielectric 132 to provide electrical connection between capacitor plate material 134 and second pillar 118.

In the shown embodiment, capacitor constructions are formed by stacking two capacitor modules on top of one another. In other embodiments, more than two capacitor modules may be stacked to form capacitor constructions. Also, in the shown embodiment, the capacitor modules comprise pillar-shaped storage nodes. In other embodiments, one or more of the capacitor modules may be container-shaped, or may be configured so that the final capacitor construction is a container-type capacitor, rather than a pillar-type capacitor. In some embodiments, all capacitor modules utilize pillar-shaped storage nodes, except for the top capacitor modules which utilize more complicated shapes of storage nodes to increase capacitive area.

Numerous advantages may be achieved utilizing various embodiments. For instance, some embodiments may allow a large aspect ratio to be achieved to enable creation of denser arrays of capacitors than may be achieved by conventional methods, while maintaining comparable capacitance per capacitor; with the capacitors being taller and skinnier than conventional capacitors. Conventionally-formed high-aspect-ratio capacitors may lean or break due to mechanical stability problems. However, some embodiments may avoid mechanical stability problems of conventional methods by fabricating capacitors vertically in sections, with each section being mechanically stabilized before beginning the next. Accordingly, instead of fabricating a capacitor as a 3 micron tall single structure (as would be done utilizing conventional methods), the capacitor may instead be fabricated as two 1.5 micron tall modules that are stacked on top of each other to form a final capacitor structure that is 3 microns tall. A further advantage of some embodiments is that the building of a capacitor in sections may enable intermittent processing to be conducted between the capacitor sections. For example, metal/conductive layers may be formed to build contacts to other parts of a circuit at an intermediate step between formation of one capacitor section, and formation of the next capacitor section.

The shown embodiment of FIGS. 1-23 forms contacts to peripheral circuitry during formation of capacitor modules (specifically, forms columns 70, 120 and 201 to connect to peripheral circuitry associated with pillar 46). This embodiment may be utilized if the capacitors get so tall that contacts to peripheral circuitry should be built in multiple levels with the capacitors. In other embodiments, the contacts to the peripheral circuitry may be formed in processing separate from that utilized to form the capacitor modules.

Some embodiments include electronic systems utilizing one or more of the DRAM arrays described above. The electronic systems may include computer systems, cars, cellular phones, televisions, cameras, etc.

Figure 24:
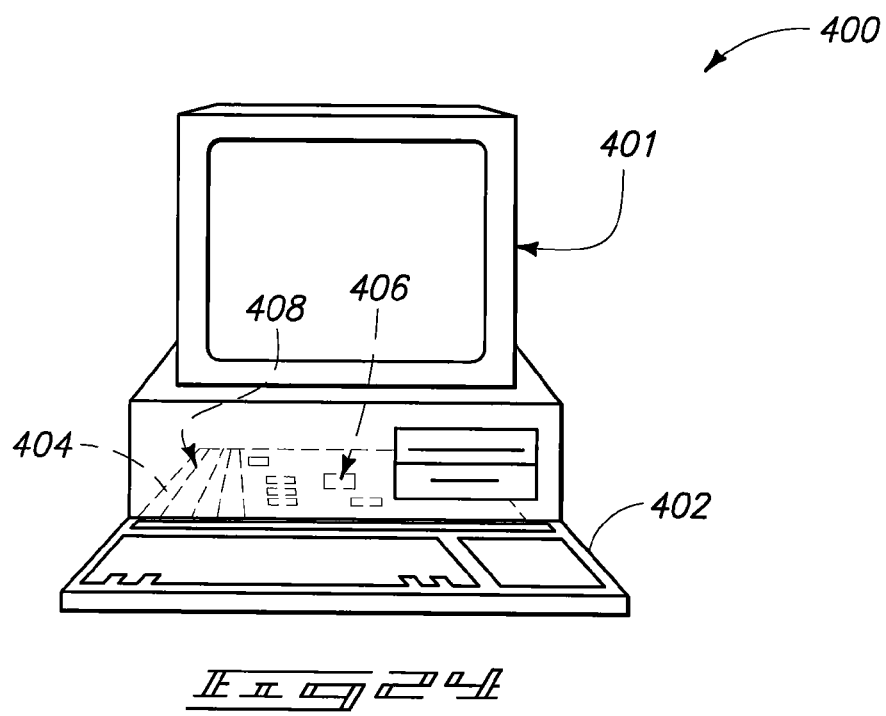
FIG. 24 is a diagrammatic view of a computer embodiment.
Figure 25:
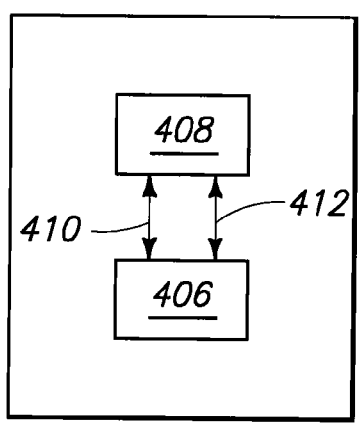
FIG. 25 is a block diagram showing particular features of the motherboard of the FIG. 24 computer embodiment.

FIG. 24 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 25. In such block diagram, the addressing circuitry is illustrated as 410 and the read circuitry is illustrated as 412.

Processor device 406 may correspond to a processor module, and associated memory utilized with the module may comprise DRAM.

Memory device 408 may correspond to a memory module, and may comprise DRAM.

Figure 26:
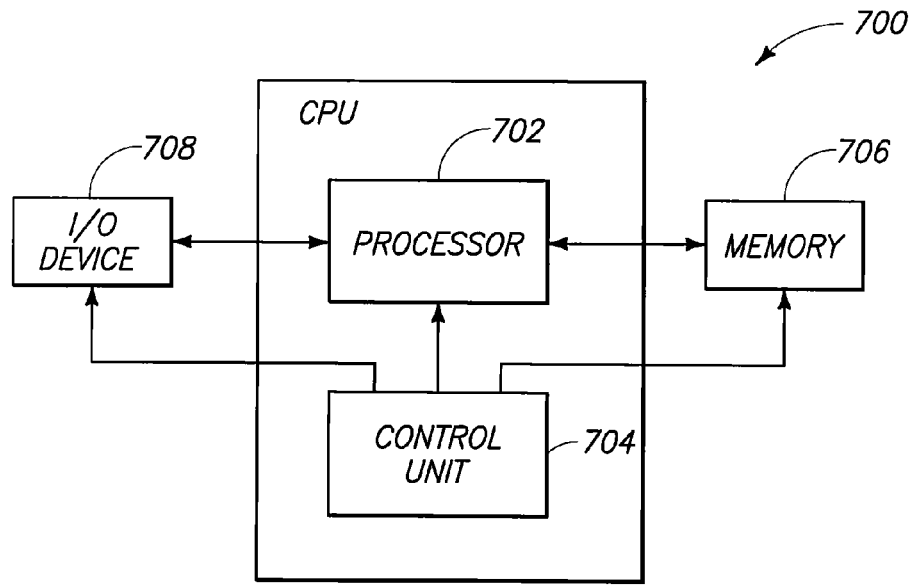
FIG. 26 is a high level block diagram of an electronic system embodiment.

FIG. 26 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include DRAM.

Figure 27:
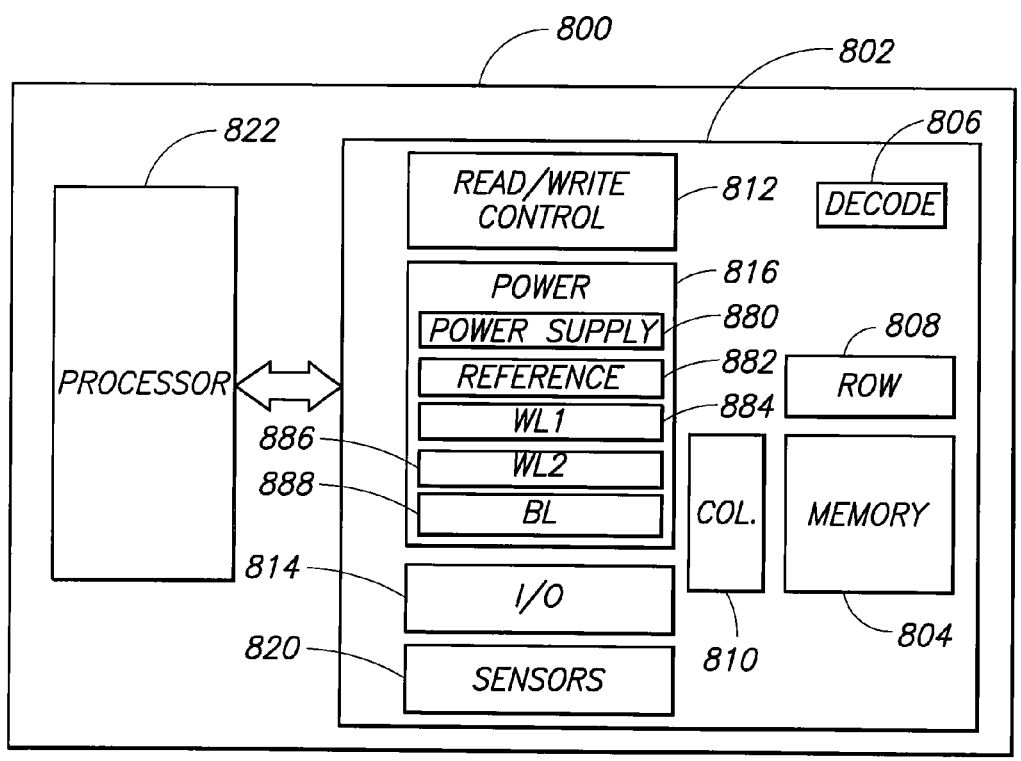
FIG. 27 is a simplified block diagram of a memory device embodiment.

FIG. 27 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include DRAM.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a capacitor, comprising:
    forming a first section of the capacitor over a memory array region of a semiconductor substrate; the first section comprising a first capacitor storage node, a first dielectric material over the first capacitor storage node, and a first capacitor outer electrode material over the first dielectric material;
    electrically connecting the first capacitor outer electrode material to a first conductive interconnect that is over a region of the semiconductor substrate peripheral to the memory array region;
    forming a second section of the capacitor over the first section of the capacitor; the second section comprising a second capacitor storage node, a second dielectric material over the second capacitor storage node, and a second capacitor outer electrode material over the second dielectric material; the second capacitor storage node being in electrical contact with the first capacitor storage node;

electrically connecting the second capacitor outer electrode material to a second conductive interconnect that is over the region of the semiconductor substrate peripheral to the memory array region; and electrically connecting the first and second conductive interconnects to one another to electrically couple the first and second capacitor outer electrode materials to one another.

2. The method of claim 1 wherein the first and second capacitor storage nodes comprise pillars having a first lateral width, wherein the second capacitor storage node is formed to be in electrical contact with the first capacitor storage node by forming an electrically conductive neck between the first and second capacitor storage nodes, and wherein the electrically conductive neck has a second lateral width which is less than the first lateral width.

3. The method of claim 1 wherein the first and second capacitor storage nodes are the same composition as one another, and wherein the first and second conductive interconnects are the same composition as the first and second capacitor storage nodes.

4. The method of claim 1 wherein the first and second capacitor storage nodes are the same composition as one another, and wherein the first and second conductive interconnects are different in composition from the first and second capacitor storage nodes.

5. The method of claim 1 wherein the first and second capacitor dielectric materials extend from the first and second sections of the capacitor to physically contact the first and second conductive interconnects.

6. A method of forming a capacitor, comprising:
    forming a first segment of a capacitor storage node over a semiconductor substrate, the first segment having a top surface and having sidewall surfaces extending downwardly from the top surface;
    forming first dielectric material over the top surface and along the sidewall surfaces;
    forming first capacitor plate material over the first dielectric material;
    forming an electrically insulative layer across the first capacitor plate material;
    etching through the electrically insulative layer, capacitor plate material and first dielectric to form an opening extending to the first segment of the capacitor storage node;
    lining sidewalls of the opening with an electrically insulative spacer while leaving the first segment of the capacitor storage node exposed at a bottom of the opening;
    forming a second segment of the capacitor storage node over the first segment of the capacitor storage node, the second segment extending within the opening to directly contact the first segment;
    forming second dielectric material over the second segment;
    forming second capacitor plate material over the second dielectric material; and
    electrically coupling the first and second capacitor plate materials to one another.

7. The method of claim 6 wherein the first capacitor plate material is a same composition as the second capacitor plate material.

8. The method of claim 6 wherein the lining the sidewalls of the opening comprises:
    forming a layer of electrically insulative spacer material along the sidewalls and bottom of the opening; and
    anisotropically etching the layer of electrically insulative spacer material to remove the electrically insulative spacer material from the bottom of the opening while leaving the electrically insulative spacer material along the sidewalls of the opening as the electrically insulative spacer.

9. The method of claim 8 wherein the electrically insulative spacer material consists of silicon nitride.

10. The method of claim 6 wherein the first and second segments of the capacitor storage node are pillars.

11. A method of forming a plurality of capacitors, comprising:
    forming first capacitor storage node pillars over a semiconductor substrate; the first capacitor storage node pillars having top surfaces, and having sidewall surfaces extending downwardly from the top surfaces;
    forming first dielectric material over the top surfaces and along the sidewall surfaces;
    forming first capacitor plate material over the first dielectric material, the first capacitor plate material extending over the top surfaces and along the sidewall surfaces; the pillars, first dielectric material and first capacitor plate material forming a plurality of projections over the substrate, the projections having spaces between them, the projections and spaces together forming an uneven topography across the substrate;
    forming a first electrically insulative material across the uneven topography;
    planarizing an upper surface of the first electrically insulative material to form an even topography extending across the first electrically insulative material and the projections;
    forming an etch stop layer over the even topography;
    etching through the etch stop layer, first capacitor plate material and first dielectric to form openings extending to the first capacitor storage node pillars;
    lining sidewalls of the openings with electrically insulative spacers while leaving the first capacitor storage node pillars exposed at bottoms of the openings;
    forming electrical interconnect material over the etch stop and within the lined openings;
    removing the electrical interconnect material from over the etch stop while leaving the electrical interconnect material within the lined openings;
    forming second capacitor storage node pillars directly over the first capacitor storage node pillars, the second capacitor storage node pillars being connected with the first capacitor storage node pillars through the electrical interconnect material that is within the lined openings;
    forming second dielectric material over the second capacitor storage node pillars;
    forming second capacitor plate material over the second dielectric material; and
    electrically coupling the first and second capacitor plate materials to one another.

12. The method of claim 11 wherein the semiconductor substrate comprises a defined memory array region and a defined peripheral region adjacent the memory array region; wherein the capacitor storage nodes are formed over the memory array region; wherein the first and second capacitor plate materials are in electrical connection with first and second lines, respectively, extending to over the peripheral region; and wherein the coupling of the first and second capacitor plate materials to one another comprises connecting said first and second lines to one another over the peripheral region.

13. The method of claim 11 wherein the first electrically insulative material comprises silicon dioxide, and wherein the etch stop layer comprises silicon nitride.

14. The method of claim 11 wherein the first capacitor storage node pillars, the second capacitor storage node pillars, and the electrical interconnect material are of a common composition to one another.

15. The method of claim 14 wherein the electrically insulative spacers consist of silicon nitride.

16. A method of forming a DRAM array, comprising:

providing a substrate having a defined memory array region, and a defined peripheral region that is peripheral to the memory array region; the substrate having a plurality of storage node contact locations in the memory array region; the storage node contact locations being electrically coupled to source/drain regions of transistors; the substrate comprising a first planarized upper surface extending across the memory array and peripheral regions;

forming a first material over the first planarized upper surface, the first material having a second planarized upper surface;

etching a first opening over the peripheral region of the substrate, the first opening extending through the first material;

etching second openings over the memory array region of the substrate, the second openings extending through the first material to the storage node contact locations;

forming first interconnect material within the first opening;

forming first capacitor storage node pillars within the second openings;

removing at least some of the first material to leave the first capacitor storage node pillars having exposed sidewall and top surfaces, and to leave a first peripheral structure of the first interconnect material, said first peripheral structure having an exposed top surface and exposed sidewall surfaces;

forming first dielectric material over the top surfaces and along the sidewall surfaces of the first capacitor storage node pillars, and over the top surfaces and along the sidewall surfaces of the first peripheral structure;

forming first capacitor plate material over the first dielectric material; the first capacitor plate material extending over the top surfaces and along the sidewall surfaces of the first capacitor storage node pillars, and over the top surfaces and along the sidewall surfaces of the first peripheral structure;

forming a second material across the first capacitor plate material, the second material having a third planarized upper surface;

forming an etch stop layer over the third planarized upper surface;

etching through the etch stop layer, first capacitor plate material and first dielectric to form apertures extending to the first capacitor storage node pillars;

lining sidewalls of the apertures with electrically insulative spacers while leaving the first capacitor storage node pillars exposed at bottoms of the apertures;

forming node interconnect material within the apertures; and forming a fourth planarized upper surface extending across the node interconnect material within the apertures, and across the etch stop layer;

forming a third material across the fourth planarized upper surface, the third material having a fifth planarized upper surface;

etching a third opening over the peripheral region of the substrate; the third opening extending through the third material, and to the first peripheral structure;

etching fourth openings over the memory array region of the substrate; the fourth openings extending through the third material, and to the node interconnect material;

forming second interconnect material within the third opening;

forming second capacitor storage node pillars within the fourth openings;

removing at least some of the third material to leave the second capacitor storage node pillars having exposed sidewall and top surfaces, and to leave a second peripheral structure of the second interconnect material; said second peripheral structure being in direct contact with the first peripheral structure, and having an exposed top surface and exposed sidewall surfaces;

forming second dielectric material over the top surfaces and along the sidewall surfaces of the second capacitor storage node pillars, and over the top surface and along the sidewall surfaces of the second peripheral structure; and forming second capacitor plate material over the second dielectric material; the second capacitor plate material extending over the top surfaces and along the sidewall surfaces of the second capacitor storage node pillars, and over the top surface and along the sidewall surfaces of the second peripheral structure.

17. The method of claim 16 wherein the first openings and the second opening are formed simultaneously with one another, and wherein the first capacitor storage nodes are formed within the first openings simultaneously with the forming of the first interconnect material within the second opening.

18. The method of claim 16 wherein the first openings and second opening are formed sequentially with one another, and wherein the first capacitor storage nodes are formed within the first openings sequentially relative to the forming of the first interconnect material within the second opening.

19. The method of claim 18 wherein the first capacitor storage nodes comprise a different composition than the first interconnect material.

20. The method of claim 16 further comprising:

forming a fourth material over the second capacitor plate material; and forming an electrical interconnect extending through the fourth material to electrically connect with the second capacitor plate material over the peripheral region of the substrate.

* * * * *